(12) United States Patent
Mikasa

(10) Patent No.: US 9,305,924 B2
(45) Date of Patent: Apr. 5, 2016

(54) SEMICONDUCTOR DEVICE HAVING GATE ELECTRODE EMBEDDED IN GATE TRENCH

(71) Applicant: PS4 LUXCO S.A.R.L., Luxembourg (LU)

(72) Inventor: Noriaki Mikasa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/934,935

(22) Filed: Jul. 3, 2013

(65) Prior Publication Data

US 2014/0015027 A1 Jan. 16, 2014

(30) Foreign Application Priority Data

Jul. 12, 2012 (JP) ................................. 2012-156452

(51) Int. Cl.
| | |
|---|---|
| *H01L 29/66* | (2006.01) |
| *H01L 29/78* | (2006.01) |
| *H01L 27/108* | (2006.01) |
| *H01L 27/02* | (2006.01) |

(52) U.S. Cl.
CPC ........ *H01L 27/108* (2013.01); *H01L 27/10876* (2013.01); *H01L 27/10888* (2013.01); *H01L 29/66666* (2013.01); *H01L 29/7827* (2013.01); *H01L 27/0207* (2013.01)

(58) Field of Classification Search
CPC ............ H01L 29/66666; H01L 27/108; H01L 27/108888; H01L 27/10876; H01L 29/7827; H01L 27/10823; H01L 27/10855; H01L 27/10814; H01L 27/10891
See application file for complete search history.

(56) References Cited

U.S. PATENT DOCUMENTS

| | | | |
|---|---|---|---|
| 5,371,024 | A | 12/1994 | Hieda et al. |
| 6,501,119 | B1 | 12/2002 | Ohno |
| 7,465,637 | B2 | 12/2008 | Yamazaki |
| 7,521,776 | B2 | 4/2009 | Cannon et al. |
| 7,622,354 | B2 | 11/2009 | Dreeskornfeld et al. |
| 7,659,571 | B2 | 2/2010 | Yamazaki |

(Continued)

FOREIGN PATENT DOCUMENTS

| | | |
|---|---|---|
| JP | 2006-339476 | 12/2006 |
| JP | 2007-081095 | 3/2007 |

(Continued)

OTHER PUBLICATIONS

Office Action dated May 24, 2013 in U.S. Appl. No. 13/479,810.

(Continued)

*Primary Examiner* — Jarrett Stark
*Assistant Examiner* — Bitew Dinke

(57) ABSTRACT

Disclosed herein is a device that includes: a substrate having a gate trench; a gate electrode embedded in the gate trench with an intervention of a gate insulation film; and an embedded insulation film embedded in the gate trench. The substrate includes a first impurity diffusion region in contact with the embedded insulation film and a second impurity diffusion region in contact with the gate insulation film. The gate trench including a first trench portion extending in a first direction and second and third trench portions branching from the first trench portion and extending in a second direction that crosses the first direction. The gate electrode including first, second and third electrode portions embedded in the first, second and third trench portions of the gate trench, respectively. The first impurity diffusion region being sandwiched between the second and third electrode portions.

18 Claims, 33 Drawing Sheets

(56) References Cited

U.S. PATENT DOCUMENTS

| | | |
|---|---|---|
| 7,767,531 B2 | 8/2010 | Shin et al. |
| 8,395,198 B2 | 3/2013 | Uchiyama |
| 8,716,774 B2* | 5/2014 | Mikasa .................. 257/296 |
| 2001/0003367 A1 | 6/2001 | Hshieh et al. |
| 2005/0121709 A1* | 6/2005 | Ozaki .................... 257/295 |
| 2005/0133836 A1 | 6/2005 | Seo et al. |
| 2005/0167741 A1 | 8/2005 | Divakaruni et al. |
| 2005/0173744 A1 | 8/2005 | Kim et al. |
| 2005/0196947 A1 | 9/2005 | Seo et al. |
| 2006/0049445 A1 | 3/2006 | Lee et al. |
| 2006/0060936 A1* | 3/2006 | Park et al. .............. 257/510 |
| 2006/0076603 A1* | 4/2006 | Matsuda ................ 257/301 |
| 2006/0273388 A1 | 12/2006 | Yamazaki |
| 2007/0072375 A1 | 3/2007 | Yamazaki |
| 2007/0096182 A1* | 5/2007 | Schloesser et al. ..... 257/296 |
| 2007/0241380 A1 | 10/2007 | Hasunuma |
| 2008/0003753 A1 | 1/2008 | Seo et al. |
| 2008/0079046 A1 | 4/2008 | Ozaki |
| 2008/0191288 A1* | 8/2008 | Kwon et al. ............. 257/383 |
| 2008/0277745 A1 | 11/2008 | Hsu et al. |
| 2008/0283957 A1* | 11/2008 | Kang et al. ............. 257/499 |
| 2008/0284029 A1* | 11/2008 | Kim et al. ............... 257/758 |
| 2008/0303086 A1* | 12/2008 | Ueda .............. H01L 21/823437 257/330 |
| 2009/0096014 A1 | 4/2009 | Choi et al. |
| 2009/0101971 A1* | 4/2009 | Kujirai ................... 257/330 |
| 2009/0114967 A1 | 5/2009 | Lee et al. |
| 2010/0237397 A1 | 9/2010 | Uchiyama |
| 2011/0033994 A1 | 2/2011 | Fujimoto et al. |
| 2011/0049599 A1 | 3/2011 | Taketani |
| 2011/0057239 A1 | 3/2011 | Arao |
| 2011/0068393 A1 | 3/2011 | Cho et al. |
| 2011/0169066 A1* | 7/2011 | Moon et al. ............. 257/306 |
| 2011/0284969 A1* | 11/2011 | Wu ......................... 257/368 |
| 2012/0012927 A1 | 1/2012 | Uchiyama |
| 2012/0049255 A1* | 3/2012 | Ryu ........................ 257/296 |
| 2012/0052643 A1* | 3/2012 | Kim ........................ 438/272 |
| 2012/0086084 A1* | 4/2012 | Kikuchi .................. 257/369 |
| 2012/0112258 A1* | 5/2012 | Mine ...................... 257/296 |
| 2012/0119294 A1 | 5/2012 | Greene et al. |
| 2012/0132968 A1* | 5/2012 | Choi ....................... 257/296 |
| 2012/0132971 A1* | 5/2012 | Mikasa ................... 257/296 |
| 2012/0139028 A1* | 6/2012 | Park et al. ............... 257/324 |
| 2012/0164812 A1* | 6/2012 | Ryu et al. ............... 438/381 |
| 2012/0217559 A1* | 8/2012 | Kim et al. ............... 257/296 |
| 2012/0261747 A1* | 10/2012 | Park et al. ............... 257/330 |
| 2012/0273859 A1* | 11/2012 | Oyu et al. ............... 257/296 |
| 2012/0286358 A1* | 11/2012 | Sammi .................... 257/334 |
| 2012/0299073 A1* | 11/2012 | Mikasa ................... 257/296 |
| 2012/0305999 A1* | 12/2012 | Okonogi ................. 257/306 |
| 2013/0052786 A1* | 2/2013 | Lee et al. ................ 438/381 |
| 2013/0181271 A1* | 7/2013 | Oyu et al. ............... 257/296 |
| 2013/0214338 A1* | 8/2013 | Mikasa ................... 257/296 |

FOREIGN PATENT DOCUMENTS

| | | |
|---|---|---|
| KR | 100691018 | 3/2007 |
| KR | 1020100134230 | 12/2010 |

OTHER PUBLICATIONS

Notice of Allowance dated Nov. 14, 2013 in U.S. Appl. No. 13/736,381.
Office Action dated Apr. 11, 2013 in U.S. Appl. No. 13/485,335.
Office Action dated May 23, 2014 in U.S. Appl. No. 13/485,335.
Final Office Action dated Sep. 9, 2013 in U.S. Appl. No. 13/485,335.
Office Action dated Aug. 15, 2013 in U.S. Appl. No. 13/458,298.

* cited by examiner

SEMICONDUCTOR DEVICE HAVING GATE ELECTRODE EMBEDDED IN GATE TRENCH

BACKGROUND OF THE INVENTION

1. Field of the Invention

The present invention relates to a semiconductor device and a manufacturing method thereof.

2. Description of Related Art

In recent years, an integration degree of semiconductor devices such as DRAM (Dynamic Random Access Memory) have been enhanced, the gate length of transistors that make up the semiconductor devices has been increasingly reduced. However, as the gate length of the transistors is reduced, the short channel effects of the transistors become apparent, resulting in an increase in subthreshold current. As a result, as for semiconductor devices in recent years, a decline in transistors' threshold voltages (Vt) is considered a problem. To avoid the problem, one option would be to increase the impurity concentration of a semiconductor substrate to curb a decline in transistors' threshold voltages (Vt). In this case, however, another problem arises that a junction leakage current is increased. In memory cells of DRAM, an increase in junction leakage current is a factor in serious deterioration of refresh characteristics.

As a structure to avoid such a problem, each of Japanese Patent Application Laid-Open No. 2006-339476 and Japanese Patent Application Laid-Open No. 2007-081095 discloses a so-called trench gate-type transistor, a transistor in which a gate electrode is embedded in a trench that is formed on a main surface of a semiconductor substrate. The trench gate-type transistor is also called a recess channel transistor. In the trench gate-type transistor, an effective channel length (gate length) can be physically and sufficiently secured. Therefore, the use of the trench gate-type transistors for cell transistors makes it possible to realize a DRAM having minute memory cells whose minimum processing size is less than or equal to 60 nm, for example.

What is disclosed in Japanese Patent Application Laid-Open No. 2007-081095 is a DRAM including: two trenches, which are formed adjacent to each other on a semiconductor substrate; two gate electrodes, which are formed in each trench via a gate insulation film; a first impurity diffusion region, which is formed in a region of a main surface of the semiconductor substrate that is positioned between the two gate electrodes and which is an impurity diffusion region common to the two gate electrodes; and two second impurity diffusion regions, which are formed in a region of the main surface of the semiconductor substrate that is positioned between each of the two gate electrodes and an element isolation region.

In a DRAM having the trench gate-type transistor disclosed in Japanese Patent Application Laid-Open No. 2006-339476 and Japanese Patent Application Laid-Open No. 2007-081095, a channel region of the transistor is formed across three faces, or both sides and bottom of the trench.

The inventors of the present invention found that, if transistors having such a configuration are further miniaturized, it becomes impossible to ensure a sufficient on-state current of the transistors, and it becomes difficult for the DRAM to work properly. The difficulty is considered attributable to high channel resistance caused by that the channel region is formed across the three faces.

Moreover, if an arrangement pitch of trench gates is narrow, an operation state of one transistor interferes with another adjacent transistor when that one transistor is operated. Therefore, the problem becomes obvious that transistors cannot be operated independently. As for the problem, the formation of a channel region between adjacent trench gates is considered to have an adverse effect.

Furthermore, in the trench gate-type transistor, a gate electrode is so formed as to protrude above a surface of a semiconductor substrate. The protruding gate electrode makes it very difficult to form bit lines and capacitors in subsequent processes. As a result, the problem also arises that it becomes difficult to make DRAMs.

Therefore, as for a DRAM that is equipped with transistors that use trenches, what is desired is to ensure a sufficient on-state current of the transistors, as well as to provide a semiconductor device that can prevent operations of adjacent transistors from interfering with each other and eliminate difficulty in production, and a production method thereof.

SUMMARY

In one embodiment, there is provided a semiconductor device, that includes: semiconductor substrate having a gate trench that includes a first side surface, a second side surface facing to the first side surface and a bottom surface; a gate insulation film covering the first side surface, the second side surface and the bottom surface of the gate trench; a gate electrode embedded in a lower portion of the gate trench with an intervention of the gate insulation film; and an embedded insulation film embedded in an upper portion of the gate trench so as to cover an upper surface of the gate electrode. The semiconductor substrate including a first impurity diffusion region that is in contact with the embedded insulation film and a second impurity diffusion region that is in contact with at least a part of the gate insulation film provided on the bottom surface of the gate trench. The gate trench including a first trench portion extending in a first direction and second and third trench portions branching from the first trench portion and extending in a second direction that crosses the first direction. The gate electrode including first, second and third electrode portions embedded in the first, second and third trench portions of the gate trench, respectively. The first impurity diffusion region being sandwiched between the second and third electrode portions.

According to a semiconductor device of one aspect of the invention, a region of a semiconductor substrate between a first impurity diffusion region, which is provided in a region that is in contact with a first side face of a gate-electrode trench, and a second impurity diffusion region, which is provided in a region that is in contact with at least part of a gate insulation film provided along a bottom face, is a channel region of a transistor. Therefore, the effective channel length is shorter than that of a conventional semiconductor device in which all the three faces of the gate-electrode trench are a channel region. Therefore, channel resistance is reduced. When seen from a normal direction of a semiconductor substrate, the first impurity diffusion region is surrounded by a first electrode portion of a gate electrode and two second electrode portions. Therefore, effective channel width is widened, contributing to a reduction in channel resistance. Thus, it is possible to ensure a sufficient on-state current of transistors.

Also, even if an arrangement pitch of the gate electrodes is narrow, it is possible to keep an operation state of a transistor from interfering with another transistor that is adjacent to the transistor. As a result, it is possible to operate individual transistors independently. Moreover, the fact that, in the gate electrode, a second electrode portion is so provided as to extend in a direction that is different from an extending direction of the first electrode portion is equivalent to that the line width of a part of a word line that constitutes the gate electrode is widened. As a result, it is possible to reduce the resistance of the word line. Moreover, the gate electrode does not protrude above a surface of the semiconductor substrate. Therefore, for example, when a DRAM is formed as a semiconductor device, it becomes easier to form bit lines and capacitors in subsequent processes. Thus, the semiconductor device can be easily produced.

DETAILED DESCRIPTION OF THE EMBODIMENTS

A new finding by the inventors of the present invention is: that, as memory cells of a DRAM are miniaturized, the distance between two adjacent cells provided in one active region is reduced; and that, when data "0" is accumulated in one cell and data "1" in another cell, and when the one cell is continuously accessed, the data accumulated in the another cell is destroyed as a result, i.e. a disturb failure between adjacent cells (simply referred to as "disturb failure," hereinafter) occurs. The problem is that the disturb failure can undermine the reliability of the semiconductor device.

Figure 22:
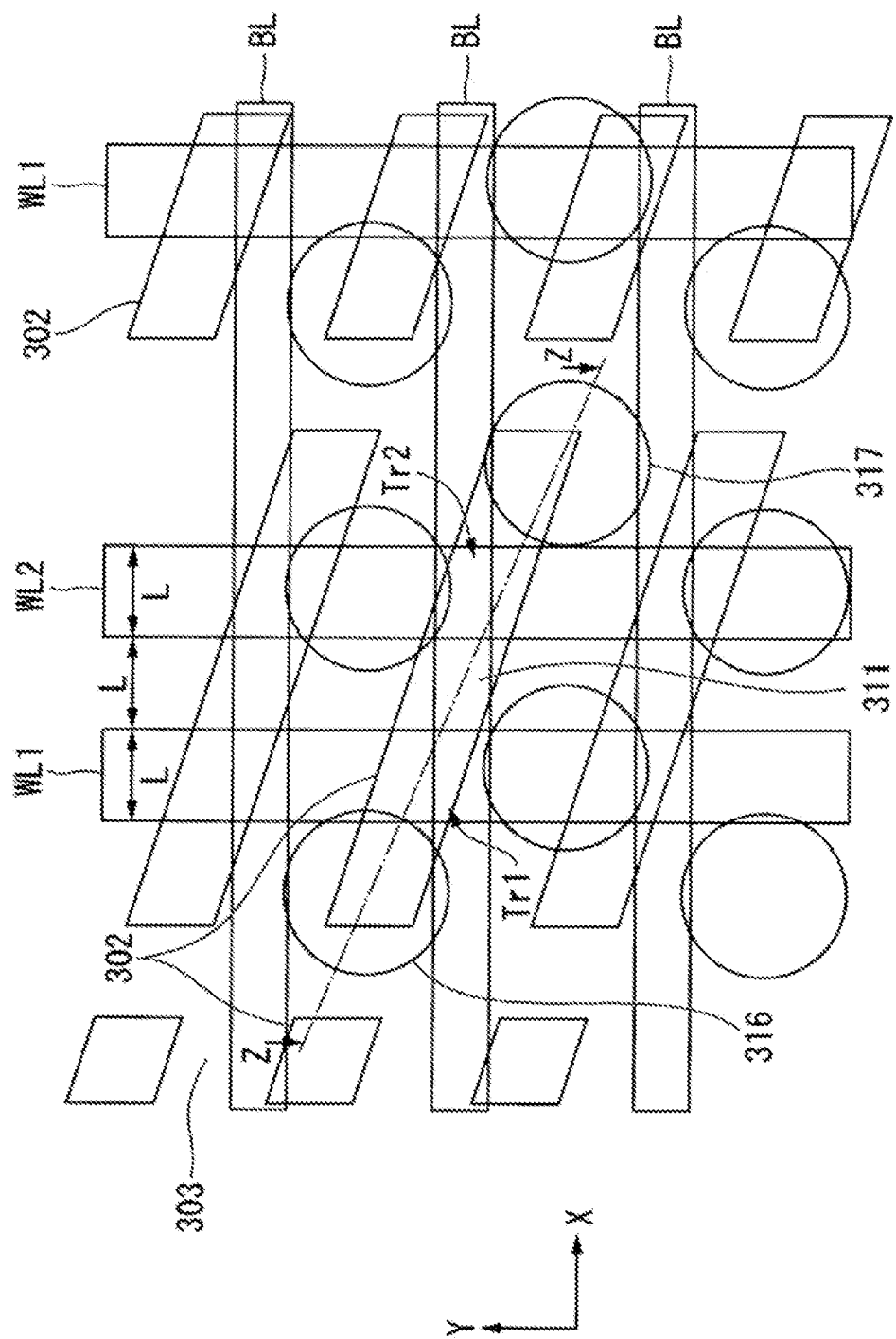
FIG. 22 is a plane view showing one example of a layout of a DRAM according to background art.
Figure 23:
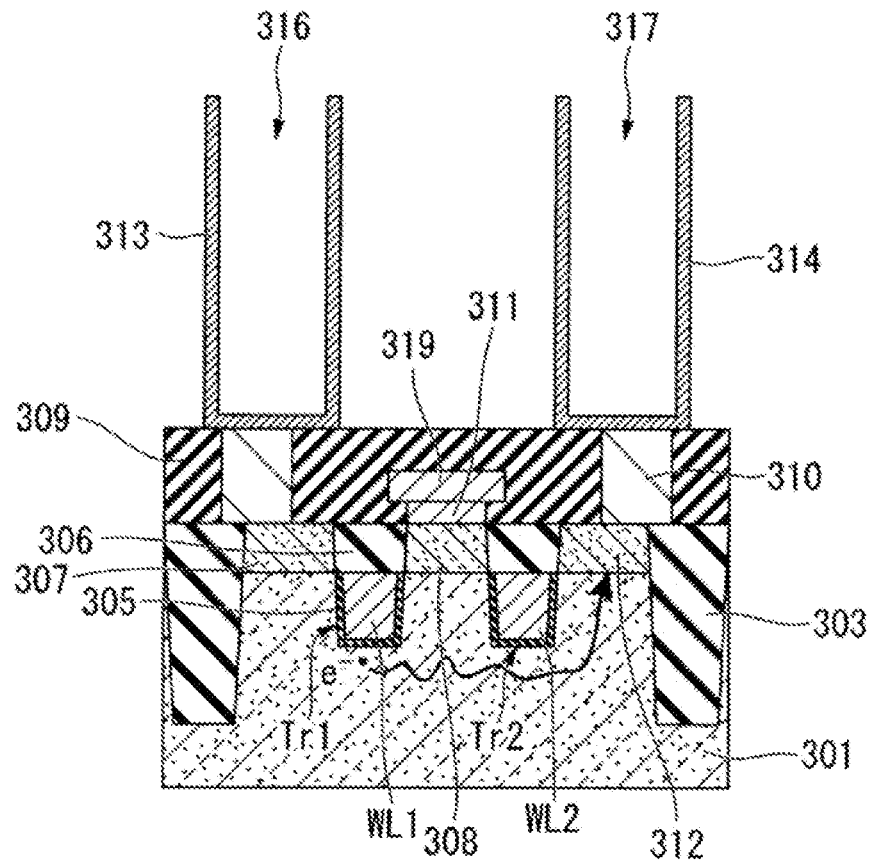
FIG. 23 is a cross-sectional view of the DRAM of background art taken along line Z-Z shown in FIG. 22.

Hereinafter, with reference to FIGS. 22 and 23, findings by the inventors about the above-described disturb failure will be described. As shown in FIGS. 22 and 23, on a surface of a semiconductor substrate 301, a plurality of active regions 302 are provided, and are arranged in a regular pattern. Each active region 302 is surrounded by an element isolation region 303, which is made by embedding an insulation film in a trench formed on the surface of the semiconductor substrate 301. On the surface of the semiconductor substrate 301, a plurality of word lines WL1 and WL2 are disposed. Each of the word lines WL1 and WL2 extend in a Y-direction, which is a direction that crosses the active region 302.

As shown in FIG. 23, the word lines WL1 and WL2 each are embedded, through a gate insulation film 305, in lower portions of trenches, which are provided across a plurality of active regions 302 and element isolation regions 303. In upper portions of the trenches, a cap insulation film 306 is embedded. Upper faces of the word lines WL1 and WL2 are covered with the cap insulation film 306. As shown in FIG. 22, in one active region 302, two word lines, which include word lines WL1 and WL2, are so provided as to cross.

Two transistors Tr1 and Tr2, whose gate electrodes are respectively word lines WL1 and WL2, correspond to one active region 302. The transistor Tr1 is so formed as to include a gate electrode, which is the word line WL1, and a drain diffusion layer 307 and a source diffusion layer 308. The transistor Tr2 is so formed as to include a gate electrode, which is the word line WL2, and a drain diffusion layer 312 and a source diffusion layer 308. The source diffusion layer 308 is common to the transistors Tr1 and Tr2, is connected to a bit line 319 (or a bit line BL shown in FIG. 22) via a bit line contact 311.

The drain diffusion layers 307 and 312 are connected to lower electrodes 313 and 314 (storage nodes), respectively, via capacitance contact plugs 310, which are formed on an interlayer insulation film 309. The lower electrodes 313 and 314, along with capacitance insulation films and upper electrodes (not shown), constitute capacitance elements 316 and 317, respectively. Bottom faces of the trenches in which the word lines WL1 and WL2 are embedded, and areas of the surface of the semiconductor substrate 301 that correspond to two side faces that face each other in an X-direction are channels of the transistors Tr1 and Tr2.

In the semiconductor device having the above configuration, for example, if the word line WL1 is turned into an on-state to form a channel of the transistor Tr1, and if a Low (L)-level potential is applied to a bit line 319, the lower electrode 313 becomes in a "L"-state. After that, as the word line WL1 is turned into an off-state, information of "L" (data "0") is accumulated in the lower electrode 313.

If the word line WL2 is turned into an on-state to form a channel of the transistor Tr2, and if a High (H)-level potential is applied to the bit line 319, the lower electrode 314 becomes in a "H"-state. After that, as the word line WL2 is turned into an off-state, information of "H" (data "1") is accumulated in the lower electrode 314.

Given that "L" is accumulated in the lower electrode 313, and "H" in the lower electrode 314 by utilizing such nature of the semiconductor device. And given that, in this state, the word line WL1 corresponding to the "L"-side lower electrode 313 is repeatedly turned on/off (which is equivalent to an operation of a cell in another active region that uses the same word line WL1).

Then, at times, electrons e– that are induced in the channel of the transistor Tr1 reach the drain diffusion layer 312. As a result, the information of "H" accumulated in the lower electrode 314 may be destroyed and turned into information of "L." The phenomenon is a so-called disturb failure, by which data "1" is turned into data "0." The frequency of occurrence of the disturb failure in a plurality of memory cells connected to the word line WL2 is dependent on the number of times the word line WL1 is turned on/off. In one example, the frequency of occurrence of a disturb failure is as follows: after the word line WL1 is repeatedly turned on/off 10,000 times, one of a plurality of the memory cells is destroyed; and after the word line WL1 is repeatedly turned on/off 100,000 times, ten memory cells are destroyed.

In the semiconductor device (DRAM), adjacent memory cells need to hold information independently. If the above-described disturb failure occurs, a normal operation of the semiconductor device (DRAM) is hindered, thereby undermining the reliability. The disturb failure is not a problem when the size of cells are large, or when the distance L (see FIG. 22) between the word lines WL1 and WL2, which is defined by a minimum processing size, is for example 70 nm. However, as the memory cells are made smaller, and as the distance L is for example less than 50 nm, a disturb failure begins to have an impact. If the distance L is further reduced, a bigger problem is likely to occur.

The following describes in detail an embodiment of the present invention with reference to the accompanying drawings. Incidentally, the drawings used in the following description are intended to explain the configuration of one embodiment. Therefore, the size, thickness, dimensions, and other factors of each component shown in the diagrams may be different from dimensional relationships of actual semiconductor devices.

Figure 1:
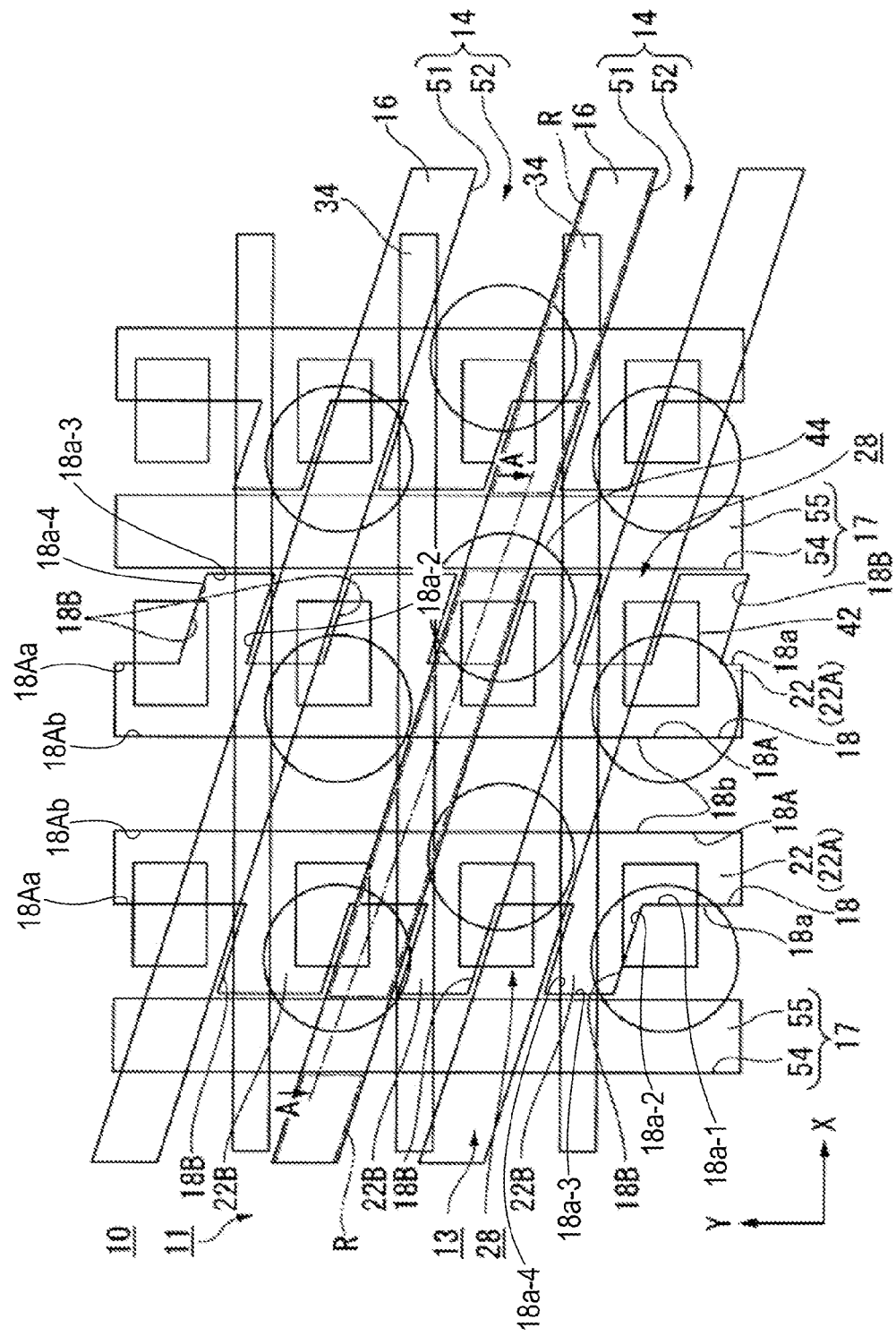
FIG. 1 is a diagram showing planar, positional relationship between components contained in a memory cell array that a semiconductor device has, according to an embodiment of the present invention.
Figure 2:
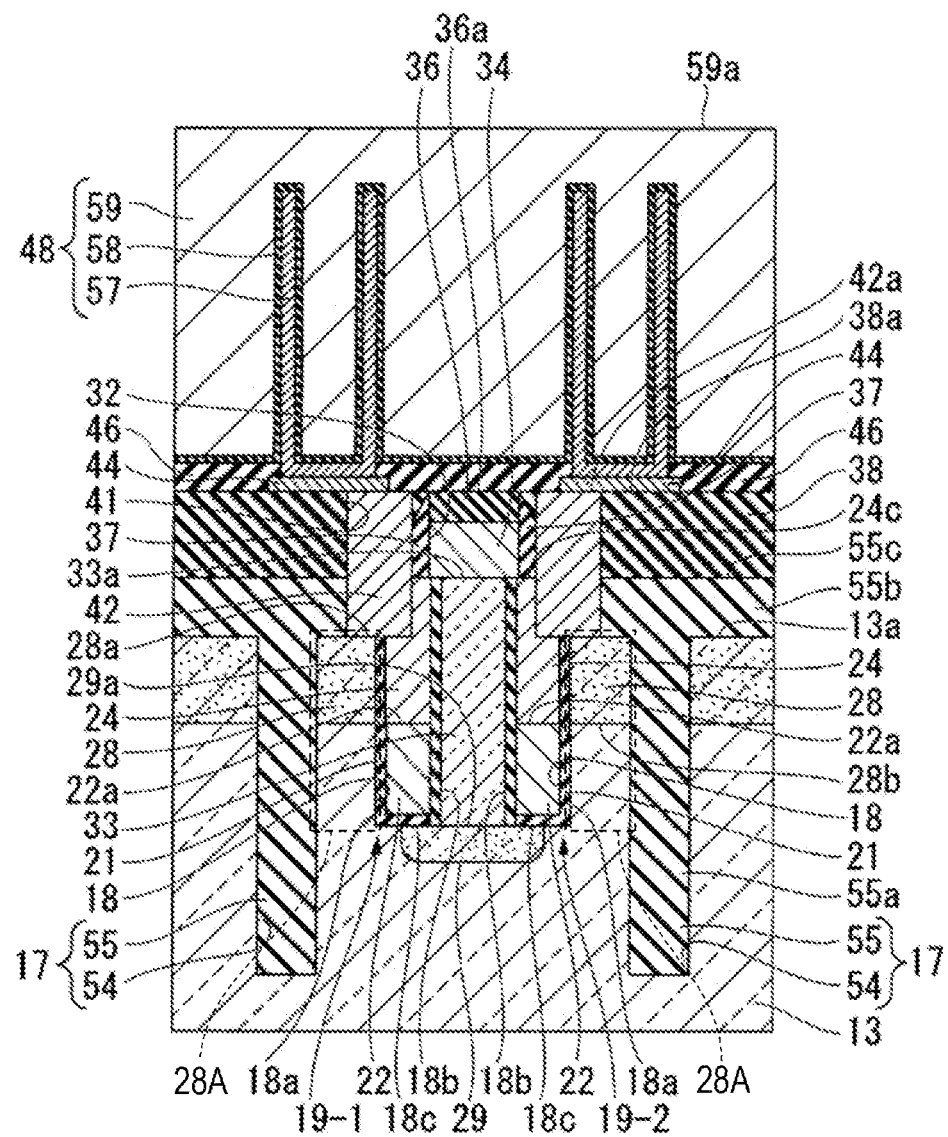
FIG. 2 is a cross-sectional view of a semiconductor device taken along line A-A shown in FIG. 1.

FIGS. 1 and 2 show a DRAM as one example of a semiconductor device 10 of the present embodiment. FIG. 1 shows one example of a layout of a memory cell array 11 of the DRAM. In FIG. 1, an X-direction is a direction in which bit lines 34 extend. A Y-direction is a direction that crosses the X-direction, and a direction in which gate electrodes 22 and second element isolation regions 17 extend (First direction).

For ease of explanation, among components of the memory cell array 11, FIG. 1 only shows: a semiconductor substrate 13, first element isolation regions 14, active regions 16, second element isolation regions 17, gate-electrode trenches 18, gate electrodes 22, bit lines 34, capacitance contact plugs 42, capacitance contact pads 44, and a plurality of element formation regions R. The other components are not shown in the diagram. FIG. 2 schematically shows a bit line 34, which actually extends in the X-direction as shown in FIG. 1. In FIG. 2, the same components as those of the semiconductor device 10 shown in FIG. 1 are represented by the same reference symbols.

The semiconductor device 10 of the present embodiment includes a memory cell region, in which the memory cell array 11 shown in FIGS. 1 and 2 is formed; and a region (peripheral circuit region), which is disposed around the memory cell region and in which peripheral circuits (not shown) are formed. As shown in FIGS. 1 and 2, the memory cell array 11 provided in the semiconductor device 10 of the present embodiment includes a semiconductor substrate 13; first element isolation regions 14; active regions 16, which have a plurality of element formation regions R; second element isolation regions 17; gate-electrode trenches 18; a first transistor 19-1 and a second transistor 19-2; gate insulation films 21; gate electrodes 22; embedded insulation films 24; first impurity diffusion regions 28; second impurity diffusion regions 29; bit-line contact plugs 33; bit lines 34; cap isolation films 36; sidewall films 37; interlayer insulation films 38; capacitance contact holes 41; capacitance contact plugs 42; capacitance contact pads 44; silicon nitride films 44; and capacitors 48. The gate electrodes 22 are formed as embedded gate electrodes.

For the semiconductor substrate 13, for example, a p-type single crystal silicon substrate is preferably used. In this case, the p-type impurity concentration of the semiconductor substrate 13 is preferably $1 \times 10^{16}$ atoms/cm$^2$.

As shown in FIG. 1, a first element isolation region 14 includes a first element isolation trench 51, and a first element isolation insulation film 52, which is embedded in the first element isolation trench 51. On the surface of the semiconductor substrate 13, a plurality of first element isolation trenches 51 are formed. A plurality of first element isolation trenches 51 each extend in a direction (second direction) that is inclined at a predetermined angle with respect to the X direction, and are arranged side by side at predetermined intervals in the Y-direction. The depth of each of the first element isolation trenches 51 is preferably 250 nm, for example. The first element isolation insulation film 52 is an insulation film with which the first element isolation trenches 51 are filled. Although not shown in the diagram, an upper surface of the first element isolation insulation film 52 constitutes the same plane as a main surface 13a (FIG. 2) of the semiconductor substrate 13. For the first element isolation insulation film 52, for example, a silicon nitride film (SiN film) is preferably used. By the first element isolation regions 14 having the above configuration, active regions 16 are partitioned off so as to extend in the second direction in the shape of a strip.

As shown in FIGS. 1 and 2, a second element isolation region 17 includes a second element isolation trench 54, and a second element isolation insulation film 55, which is embedded in the second element isolation trench 54. On the surface of the semiconductor substrate 13, a plurality of second element isolation trenches 54 are formed. A plurality of second element isolation trenches 54 each extend in the Y-direction (first direction), and are arranged side by side at predetermined intervals in the X-direction. Since the second element isolation trenches 54 extend in the Y-direction, the second element isolation trenches 54 each traverse the first element isolation regions 14. Two second element isolation trenches 54 that are adjacent to each other are so formed that two adjacent gate electrodes 22 are sandwiched therebetween. The depth of the second element isolation trenches 54 is preferably 250 nm, for example.

Each of the gate electrodes 22 constitutes a word line of a memory cell. That is, the memory cell array 11 of the present embodiment is so formed that one second element isolation region 17 and two gate electrodes 22 (word lines), which extend in the Y-direction, are grouped as one unit block; and that the unit blocks are repeatedly disposed in the X-direction.

As shown in FIG. 2, a second element isolation insulation film 55 includes an embedded portion 55a, which is embedded in a second element isolation trench 54; and a flat portion 55b, which is formed integrally with the embedded portion 55a along the main surface 13a of the semiconductor substrate 13. For the second element isolation insulation film 55, for example, a silicon dioxide film (SiO$_2$ film) is preferably used. When a method of producing a semiconductor device of the present embodiment, described later, is applied, it is desirable that the material of the first element isolation insulation film 52 be different from the material of the second element isolation insulation film 55. By the second element isolation regions 17 having the above configuration, a plurality of element formation regions R, which are obtained by dividing the active regions 16 in the X-direction, are partitioned off.

In that manner, the memory cell array 11 of the present embodiment includes the first element isolation regions 14, which have a structure in which a first element isolation insulation film 52 is embedded in a first element isolation trench 51 formed in the semiconductor substrate 13; and the second element isolation regions 17, which has a structure in which a second element isolation insulation film 55 is embedded in a second element isolation trench 54 formed in the semiconductor substrate 13. A plurality of element formation regions R are partitioned off by the first element isolation regions 14 and the second element isolation regions 17. In a conventional semiconductor device, a dummy gate electrode is provided, through a gate insulation film, in a trench that is equivalent to the second element isolation trench; and a negative potential is applied so that the dummy gate electrode functions as an element isolation region. However, the negative potential that is applied to the dummy gate electrode may affect an operation of an adjacent transistor. In the semiconductor device 10 of the present embodiment, the element isolation regions are made of an insulation film. Therefore, unlike the above case, there is no need to apply the potential. The potential that is applied to the first element isolation regions 14 and the second element isolation regions 17 does not have an adverse effect on the first transistor 19-1 and the second transistor 19-2. Therefore, it is possible to ensure operations of the first transistor 19-1 and second transistor 19-2, as well as to improve data-retaining characteristics of the memory cell array 11.

As shown in FIGS. 1 and 2, gate-electrode trenches 18 are provided in a region that is positioned between two second element isolation regions 17 that are adjacent to each other in the X-direction within the surface of the semiconductor substrate 13. In one region, one pair of gate-electrode trenches 18 is provided. Each gate-electrode trench 18 includes a first trench portion 18A, which extends in the first direction (Y-direction); and a second trench portion 18B, which diverges from the first trench portion 18A and extends in the second direction. The second trench portion 18B is so shaped as to protrude from the first trench portion 18A to the second element isolation region 17; a tip portion thereof reaches the second element isolation trench 54.

A gate-electrode trench 18 includes inner faces, including a first side face 18a and a second side face 18b, which face each other; and a bottom face 18c. Also, the first trench portion 18A includes inner faces, including a first side face 18Aa and a second side face 18Ab. The second side face 18b coincides with the second side face 18Ab and extends linearly in Y-direction. The first side face 18a is configured by the first to fourth portions 18a-1 to 18a-4. The first portion 18a-1 coincides with the first side face 18Aa and faces the second side face 18Ab. The second to fourth portions 18a-2 to 18a-4 give form to the second trench portion 18B. The third portion 18a-3 coincides with a side face of the second element isolation trench 54. Each of the second portion 18a-2 and the second portion 18a-4 extends in the second direction alongside of the element formation region R. One end of each of the second portion 18a-2 and the second portion 18a-4 is connected to the first portion 18a-1. The other end of each of the second portion 18a-2 and the second portion 18a-4 is connected to the third portion 18a-3. One pair of gate-electrode trenches 18 corresponding to one element formation region R are so disposed that the second side faces 18b of the two face each other. One pair of gate-electrode trenches 18 are so disposed that the second trench portions 18B of the two face opposite directions with respect to the second direction.

A gate-electrode trench 18 is so formed that the depth thereof is shallower than the depth of a first element isolation trench 51 and second element isolation trench 54 (or the depth of a first element isolation region 14 and second element isolation region 17). For example, when the depth of a first element isolation trench 51 and second element isolation trench 54 is 250 nm, the depth of a gate-electrode trench 18 is preferably 150 nm, for example.

As shown in FIG. 2, both the first transistor 19-1 and the second transistor 19-2 are transistors of a trench gate type. The first transistor 19-1 and the second transistor 19-2 each include a gate insulation film 21, a gate electrode 22, an embedded insulation film 24, a first impurity diffusion region 28, and a second impurity diffusion region 29.

As shown in FIG. 2, the first transistor 19-1 and the second transistor 19-2 are disposed adjacent to each other. The second impurity diffusion region 29 functions as a source/drain region (or a drain region in the case of the structure shown in FIG. 2) that is common to the first transistor 19-1 and the second transistor 19-2. The second side face 18b of the first trench portion 18A of the gate-electrode trench 18 that constitutes the first transistor 19-1 faces the second side face 18b of the first trench portion 18A of the gate-electrode trench 18 that constitutes the first transistor 19-2, as described above. The second impurity diffusion region 29 is provided in a region that is adjacent to: at least a part of the gate insulation film 21 that is provided along the bottom face 18c of the gate-electrode trench 18 that constitutes the first transistor 19-1; and at least a part of the gate insulation film 21 that is provided along the bottom face 18c of the gate-electrode trench 18 that constitutes the second transistor 19-2. If the semiconductor substrate 13 is a p-type silicon substrate, the second impurity diffusion region 29 is formed by ion-implanting n-type impurities into the semiconductor substrate 13.

The gate insulation film 21 is integrally formed along the first, second, and fourth portions 18a-1, 18a-2, 18a-4 of the first side face 18a, the second side face 18b, and the bottom face 18c. As the gate insulation film 21, for example, the following films are preferably used: a single-layer silicon dioxide film ($SiO_2$ film); a film that is obtained by nitriding of the silicon dioxide film (SiON film); a stacked silicon dioxide film ($SiO_2$ film); and a stacked film that is made by stacking a silicon nitride film (SiN film) on a silicon dioxide film ($SiO_2$ film). If a single-layer silicon dioxide film ($SiO_2$ film) is used as the gate insulation film 21, the thickness of the gate insulation film 21 is preferably 6 nm, for example.

As shown in FIG. 2, a gate electrode 22 is provided in such a way as to be embedded, through a gate insulation film 21, in a lower portion of a gate-electrode trench 18. As a result, an upper surface 22a of the gate electrode 22 is disposed at a lower position than the main surface 13a of the semiconductor substrate 13. As shown in FIG. 1, a gate electrode 22 includes a first electrode portion 22A, which is embedded in a first trench portion 18A of a gate-electrode trench 18; and a second electrode portion 22B, which is embedded in a second trench portion 18B of the gate-electrode trench 18. Accordingly, the gate electrode 22 includes the first electrode portion 22A, which extends in the first direction (Y-direction); and the second electrode portion 22B, which diverges from the first electrode portion 22A and extends in the second direction (or a direction that is inclined at a predetermined angle relative to the X-direction). A tip portion of the second electrode portion 22B reaches a second element isolation insulation film 55 (the third portion 18a-3). The first electrode portion 22A and second electrode portion 22B of the gate electrode 22 are formed integrally. As for a specific configuration of the gate electrode 22, for example, a stacked structure in which a titanium nitride film and a tungsten film are sequentially stacked is preferably employed.

As shown in FIG. 2, an embedded insulation film 24 is so provided as to be embedded in a gate-electrode trench 18, in which a gate insulation film 21 is formed on an inner face thereof, as well as to cover a upper surface 22a of a gate electrode 22. An upper portion of the embedded insulation film 24 protrudes from the main surface 13a of the semiconductor substrate 13. An upper surface 24c of the protruding portion constitutes the same plane as an upper surface 55c of a second element isolation insulation film 55. As the embedded insulation film 24, for example, a silicon dioxide film ($SiO_2$ film) is preferably used.

As shown in FIG. 2, a first impurity diffusion region 28 gives form to a semiconductor pillar 28A along with a channel region of a vertical transistor which is connected to the bottom surface of the first impurity diffusion region 28. The semiconductor pillar 28A is basically made of a silicon substrate and is surrounded by the side face of the second element isolation trench 54 and the first portion 18a-1 of the first side face 18a, which face in the second direction each other, and the second portion 18a-2 and the fourth portion 18a-4, which face in Y-direction each other. The above-mentioned gate insulation film 21 is disposed on the first, second, and fourth portions 18a-1, 18a-2, 18a-4. Therefore, the semiconductor pillar 28A configured by the first impurity diffusion region 28 and the channel region is configured so as to that one side face touches the second element isolation insulation film 55 and the other three side faces are covered by the gate insulation film 21.

Therefore, the first impurity diffusion region 28 has a configuration in which the first impurity diffusion region 28 is disposed in the upper part of the semiconductor pillar 28A including the upper surface 13a of the semiconductor substrate 13 that is sandwiched between the first side face 18a and the second element isolation trench 54, one side face of the first impurity diffusion region 28 touches the second element isolation insulation film 55, and the other three side faces are covered by the gate insulation film 21. A bottom face 28b of the first impurity diffusion region 28 is disposed at a higher position than an upper surface 22a of a gate electrode 22 embedded in a gate-electrode trench 18 (or at a position closer to the main surface 13a of the semiconductor substrate 13). Incidentally, it is desirable that the distance between a horizontal line containing the bottom face 28b of the first impurity diffusion region 28, and a horizontal line containing the upper surface 22a of the gate electrode 22 (or the difference in height between the bottom face 28b of the first impurity diffusion region 28 and the upper surface 22a of the gate electrode 22) be 10 nm or less.

A first impurity diffusion region 28 is provided in both the first transistor 19-1 and the second transistor 19-2, and functions as a source/drain region (or a source region in the case of the structure shown in FIG. 2) for a corresponding transistor. As shown in FIG. 1, in a planar view, a first impurity diffusion region 28 is surrounded by a first electrode portion 22A, and two second electrode portions 22B that are adjacent to each other in the Y-direction. Therefore, a channel region, which is connected to the bottom face 28b of the first impurity diffusion region 28 and is a part of the semiconductor pillar 28A, is covered by the first electrode portion 22A on the first portion 18a-1 of the first side face 18a, and is covered by the second electrode portions 22B on the second portion 18a-2 and the fourth portion 18a-4. If the semiconductor substrate 13 is a p-type silicon substrate, a first impurity diffusion region 28 is formed by ion-implanting n-type impurities into the semiconductor substrate 13.

In that manner, in the memory cell array 11 of the present embodiment, in a region surrounded by a first side face 18a of a gate-electrode trench 18 and a second element isolation trench 54, a first impurity diffusion region 28 is provided. In a region of the semiconductor substrate 13 that is adjacent to bottom faces 18c of two gate-electrode trenches 18, a second impurity diffusion region 29 is provided. According to the above configuration, when the first transistor 19-1 and the second transistor 19-2 are operated, a channel is formed only in a portion of the semiconductor substrate 13 that is in contact with a gate insulation film 21 disposed on a first side face 18a, and in a portion of the semiconductor substrate 13 that constitutes a bottom face 18c of a gate-electrode trench 18. In a region that is in contact with a second side face 18b of a gate-electrode trench 18, i.e. a region between the first transistor 19-1 and the second transistor 19-2, no channel is formed. That is, among a gate-electrode trench 18, only two faces, which are one side face (first side face 18a) and a bottom face (bottom face 18c), are turned into a channel region. The other one side face (second side face 18b) does not become a channel region.

Accordingly, a channel region that is formed at a time when the first transistor 19-1 and the second transistor 19-2 are turned on is smaller than a channel region of a conventional transistor. As a result, even in a miniaturized memory cell, the channel resistance can be reduced, and the on-state current can be increased. Moreover, when the first transistor 19-1 or the second transistor 19-2 is operated, it is possible to keep the other transistor from malfunctioning. Therefore, even when the semiconductor device 10 is miniaturized, and the gate electrodes 22 are disposed at a narrow pitch, the first transistor 19-1 and the second transistor 19-2 can operate independently and stably.

As shown in FIG. 2, in a planar view, in a region that corresponds to a space between the embedded insulation films 24 formed in the upper portions of two gate-electrode trenches 18, an opening 32 is formed. The opening 32 is so formed as to expose an upper surface 33a of a bit-line contact plug 33. A bit line 34 is so provided as to be embedded in the opening 32. A lower end of the bit-line contact plug 33 is in contact with an upper surface 29a of a second impurity diffusion region 29. If the bit line 34 is made from a stacked film in which a polysilicon film, a titanium nitride (TiN) film, and a tungsten (W) film are sequentially stacked, the bit-line contact plug 33 may be made from a polysilicon film, for example.

As shown in FIG. 2, the bit line 34 is so provided that a lower surface thereof is in contact with an upper surface 33a of the bit-line contact plug 33. Therefore, the bit line 34 is electrically connected to the second impurity diffusion region 29 via the bit-line contact plug 33. As for the material of the bit line 34, the following films are preferably used: a stacked film that is made by sequentially stacking a polysilicon film, a titanium nitride film, and a tungsten film; and a single-layer film, such as a polysilicon film or a titanium nitride film.

As shown in FIG. 2, a cap insulation film 36 is so provided as to cover an upper surface of the bit line 34. The cap insulation film 36 is designed to protect the upper surface of the bit line 34, and functions as an etching mask for patterning of a base material that is turned into the bit line 34 by anisotropic dry etching. For the cap insulation film 36, a stacked film in which a silicon nitride film (SiN film) and a silicon dioxide film (SiO$_2$ film) are sequentially stacked is preferably used.

As shown in FIG. 2, a sidewall film 37 is so provided as to cover a side wall of the bit line 34. The sidewall film 37 has a function of protecting a side wall of the bit line 34. For the sidewall film 37, a stacked film in which a silicon nitride film (SiN film) and a silicon dioxide film (SiO$_2$ film) are sequentially stacked is preferably used.

As shown in FIG. 2, an interlayer insulation film 38 is provided on an upper surface 55c of a second element isolation insulation film 55. An upper surface 38a of the interlayer insulation film 38 constitutes the same plane as the upper surface 36a of the cap insulation film 36. For the interlayer insulation film 38, for example, the following film is preferably used: a silicon dioxide film (SiO$_2$ film) formed by CVD (Chemical Vapor Deposition) method, or an insulation film (silicon dioxide film (SiO$_2$ film)) formed by SOG (Spin On Glass) method.

As shown in FIG. 2, a capacitance contact hole 41 is formed in an embedded insulation film 24, a second element isolation insulation film 55, and an interlayer insulation film 38 in such a way as to expose a part of an upper surface 28a of a first impurity diffusion region 28. A capacitance contact plug 42 is so provided as to be embedded in a capacitance contact hole 41. A lower end of the capacitance contact plug 42 is in contact with a part of an upper surface 28a of a first impurity diffusion region 28. In this manner, the capacitance contact plug 42 is electrically connected to the first impurity diffusion region 28. An upper surface 42a of the capacitance contact plug 42 constitutes the same plane as an upper surface 38a of an interlayer insulation film 38. For example, it is preferred that the capacitance contact plug 42 have a stacked structure in which a titanium nitride film and a tungsten film are sequentially stacked.

As shown in FIG. 2, a capacitance contact pad 44 is provided on an upper surface 38 of an interlayer insulation film 38 in such a way that a part of the capacitance contact pad 44 is in contact with an upper surface 42a of a capacitance contact plug 42. On the capacitance contact pad 44, a lower electrode 57, which constitutes a capacitor 48, is connected. In this manner, the capacitance contact pad 44 is designed to electrically connect the capacitance contact plug 42 and the lower electrode 57.

As shown in FIG. 1, a planar shape of each capacitance contact pad 44 is circular. When seen from the Y-direction, a plurality of capacitance contact pads 44 for one gate electrode 22 are so arranged that the capacitance contact pads alternately appear at different positions in the X-direction with respect to the capacitance contact plugs 42. In terms of the Y-direction, the capacitance contact pads 44 are disposed between two adjacent bit lines 34. In other words, a series of capacitance contact pads 44 whose centers are disposed substantially at the center of a first electrode portion 22A of a gate electrode 22, and a series of capacitance contact pads 44 whose centers are disposed at a side of the first electrode portion 22A of the gate electrode 22 are repeatedly disposed in such a way that the capacitance contact pads 44 appear alternately in the Y-direction. Furthermore, in still other words, the capacitance contact pads 44 are disposed in a zigzag pattern in the Y-direction.

As shown in FIG. 2, a silicon nitride film 46 is provided on an upper surface 38a of an interlayer insulation film 38 so as to surround an outer peripheral portion of a capacitance contact pad 44. One capacitor 48 is provided for one capacitance contact pad 44. One capacitor 48 includes one lower electrode 57; a capacitance insulation film 58, which is common to a plurality of lower electrodes 57; and an upper electrode 59, which is common to a plurality of lower electrodes 57.

A lower electrode 57 is provided on a capacitance contact pad 44, and is electrically connected to the capacitance contact pad 44. The lower electrode 57 is a cylindrical conductor whose upper portion is opened. A capacitance insulation film 58 is so provided as to cover a surface of each of a plurality of lower electrodes 57, which are exposed from a silicon nitride film 46, and an upper surface of the silicon nitride film 46. An upper electrode 59 is a conductor that is so provided as to cover a surface of the capacitance insulation film 58. The upper electrode 59 is so disposed as to be embedded inside a lower electrode 57, on which a capacitance insulation film 58 is formed, and in spaces between a plurality of lower electrodes 57. An upper surface 59a of the upper electrode 59 is positioned above an upper end of each of a plurality of lower electrodes 57.

A capacitor 48 is electrically connected to a first impurity diffusion region 28 via a capacitance contact pad 44. Incidentally, in addition to the above-described components, the following components may be provided: an interlayer insulation film (not shown) that covers an upper surface 59a of the upper electrode 59; a contact plug (not shown) that is provided inside the interlayer insulation film; and a wire (not shown) that is connected to the contact plug.

In the semiconductor device 10 of the present embodiment, as described above, a channel region is formed only on a part of a bottom face 18c and a part of a first side face 18a. Therefore, compared with a conventional semiconductor device in which a channel region is formed on three inner surfaces of a gate-electrode trench (two side faces that face each other, and a bottom face), the channel length is shorter, resulting in a reduction in channel resistance. Moreover, as shown in FIG. 1, when seen from a normal direction of the semiconductor substrate 13, a first impurity diffusion region 28 (a channel region) is surrounded by a first electrode portion 22A of a gate electrode 22 and two second electrode portions 22B. Therefore, compared with the conventional case, the effective channel width is widened, contributing to a reduction in channel resistance. Thus, according to the semiconductor device 10 of the present embodiment, it is possible to ensure a sufficient on-state current of the first transistors 19-1 and the second transistor 19-2.

According to the semiconductor device 10 of the present embodiment, in a portion of the semiconductor substrate 13 that is adjacent to the gate insulation films 21 at the bottoms of two adjacent gate-electrode trenches 18, a second impurity diffusion region 29 is formed. Accordingly, even if electrons e– (not shown) that are induced in a channel of the first transistor 19-1 in case that a state in which information of "L" is accumulated in a lower electrode 57 electrically connected to the first transistor 19-1, and information of "H" is accumulated in a lower electrode 57 electrically connected to the second transistor 19-2 is formed, and, in this state, a gate electrode 22 (word line) corresponding to the first transistor 19-1 is repeatedly turned on/off, move toward a first impurity diffusion region 28 of the second transistor 19-2, the electrons are trapped by a bottom face of a second impurity diffusion region 29 that is made from n-type impurities, thereby preventing the electrons from reaching the first impurity diffusion region 28 of the second transistor 19-2. That is, the semiconductor device 10 of the present embodiment can keep the electrons e– induced in the channel of the first transistor 19-1 from reaching the first impurity diffusion region 28 (drain region) that constitutes the second transistor 19-2.

Therefore, the electrons e– induced in the channel of the first transistor 19-1 do not destroy information of "H" accumulated in the lower electrode 57 electrically connected to the second transistor 19-2, and information of "L" is not altered. Thus, according to the semiconductor device 10 of the present embodiment, the occurrence of a disturb failure, in which an operation state of one adjacent cell causes a change in an accumulation state of another cell, can be suppressed. Even in a DRAM in which the distance between two gate electrodes 22 that are disposed adjacent to each other is short and less than 50 nm, the occurrence of a disturb failure can be suppressed.

Furthermore, when seen from a normal direction of the semiconductor substrate 13, a first impurity diffusion region 28 is surrounded by a first electrode portion 22A of a gate electrode 22 and two second electrode portions 22B. Therefore, three sides of the first impurity diffusion region 28 are electrically shielded by the gate electrode 22. Therefore, even if an arrangement pitch of the gate electrodes 22 is narrow, it is possible to keep an operation state of the first transistor 19-1 from interfering with the second transistor 19-2 that is adjacent to the first transistor 19-1. As a result, it is possible to operate individual transistors independently, and suppress the occurrence of a disturb failure.

Moreover, the fact that, in a gate electrode 22, a second electrode portion 22B is so provided as to extend in a direction that is different from an extending direction of a first electrode portion 22A is equivalent to that the line width of a part of a word line that constitutes the gate electrode 22 is widened. Therefore, in the semiconductor device 10 of the present embodiment, the resistance of the word line is reduced.

Moreover, in the semiconductor device 10 of the present embodiment, a first electrode portion 22A is embedded in a first trench portion 18A of a gate-electrode trench 18 through a gate insulation film 21; a second electrode portion 22B is embedded in a second trench portion 18B of a gate-electrode trench 18 through a gate insulation film 21; and an embedded insulation film 24 is embedded in an upper portion of a gate-electrode trench 18 in such a way as to cover an upper surface of a gate electrode 22. According to the configuration, the gate electrode 22 does not protrude above the main surface 13a of the semiconductor substrate 13. Therefore, during a process of producing the semiconductor device 10, bit lines and capacitors can be easily formed after the formation of the gate electrode 22. Thus, the semiconductor device 10 can be easily produced.

With reference to FIGS. 3A to 21, the following describes a method of producing the semiconductor device 10 (or more specifically, the memory cell array 11) of the present embodiment.

Figure 3A:
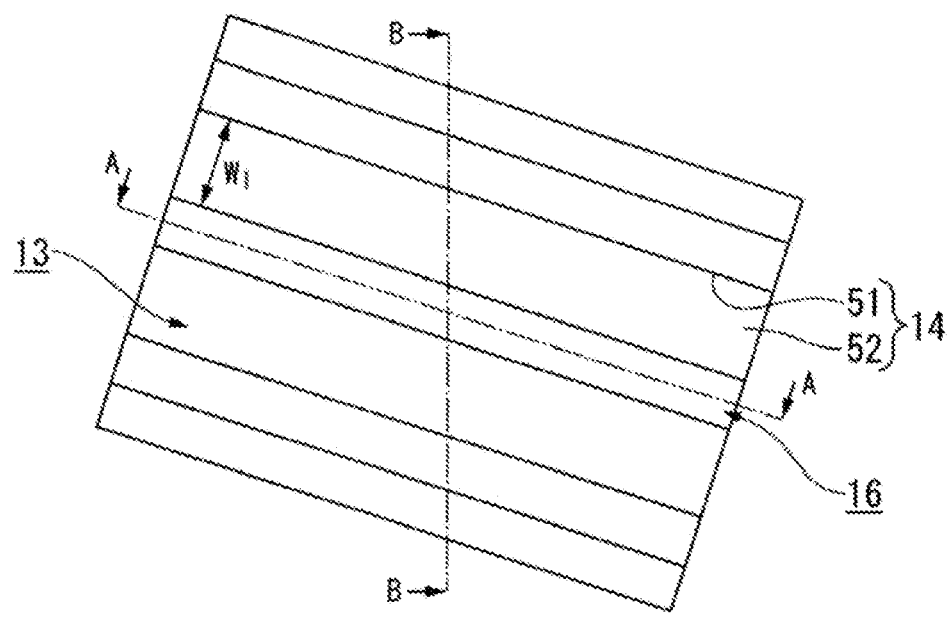
FIG. 3A is a plane view of a region where a memory cell array is formed, showing a production process (Part 1) of a memory cell array that the semiconductor device described in FIG. 1 has.
Figure 3B:
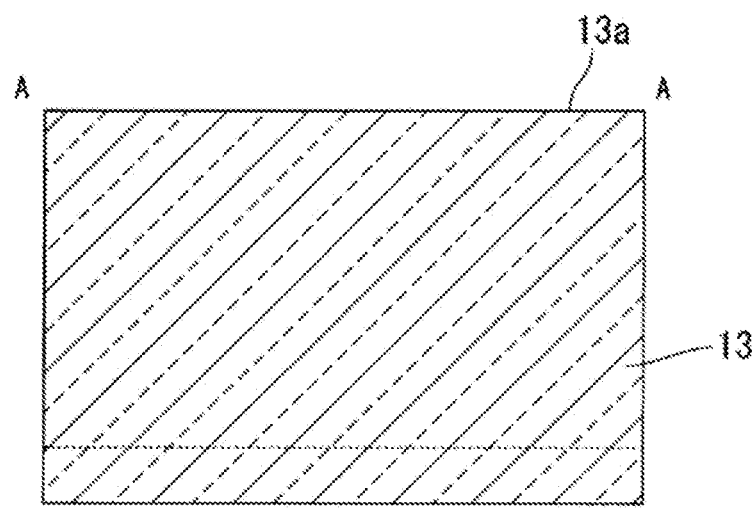
FIG. 3B is a cross-sectional view of a semiconductor device taken along line A-A of FIG. 3A.
Figure 3C:
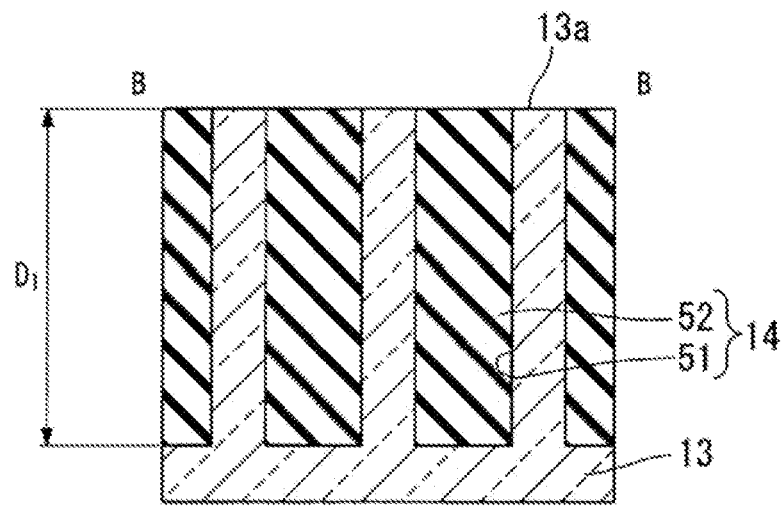
FIG. 3C is a cross-sectional view of a semiconductor device taken along line B-B of FIG. 3A.

In the processes shown in FIGS. 3A to 3C, on the main surface 13a of the semiconductor substrate 13 that is a p-type silicon substrate, a pad oxide film (not shown) is formed. Then, on the pad oxide film, a plurality of groove-shaped openings are formed. The openings each are so formed as to extend in the shape of a strip in a direction (second direction) that is inclined at a predetermined angle with respect to the X direction, and are arranged at predetermined intervals in the Y-direction. More specifically, the openings are preferably formed on the pad oxide film in the following manner: first, a photoresist (not shown) is formed on the pad oxide film, and patterning of the photoresist is carried out by photolithography method; and, by using the patterned photoresist as a mask, anisotropic etching is carried out to perform etching of a silicon dioxide film. In this manner, on the pad oxide film, the openings are formed. After the openings are formed, the photoresist is removed.

Then, by using the pad oxide film having the openings as a mask, anisotropic etching (or more specifically, dry etching) is carried out to perform etching of the semiconductor substrate 13. As a result, a first element isolation trench 51 is so formed as to extend in the second direction. For example, it is preferred that width W1 of the first element isolation trench 51 be 43 nm; and that depth D1 of the first element isolation trench 51 (which is a depth that is measured with respect to the main surface 13a of the semiconductor substrate 13) be 250 nm.

Then, a first element isolation insulation film 52, which is embedded in the first element isolation trench 51, is formed. More specifically, the CVD method is used to form a silicon nitride film (SiN film) in such a way that the silicon nitride film is embedded in the first element isolation trench 51. Then, the CMP (Chemical Mechanical Polishing) method is used to remove a silicon nitride film that is formed above an upper surface of the pad oxide film. As a result, only inside the first element isolation trench 51, a first element isolation insulation film 52, which is made from a silicon nitride film, is formed. A first element isolation region 14, which is designed to partition off strip-shaped active regions 16 extending in the second direction, is completed. Then, by using a HF (hydrogen fluoride)-based etching solution, the pad oxide film is removed. As a result, on the main surface 13a of the semiconductor substrate 13, the strip-shaped active regions 16 are exposed.

Figure 4A:
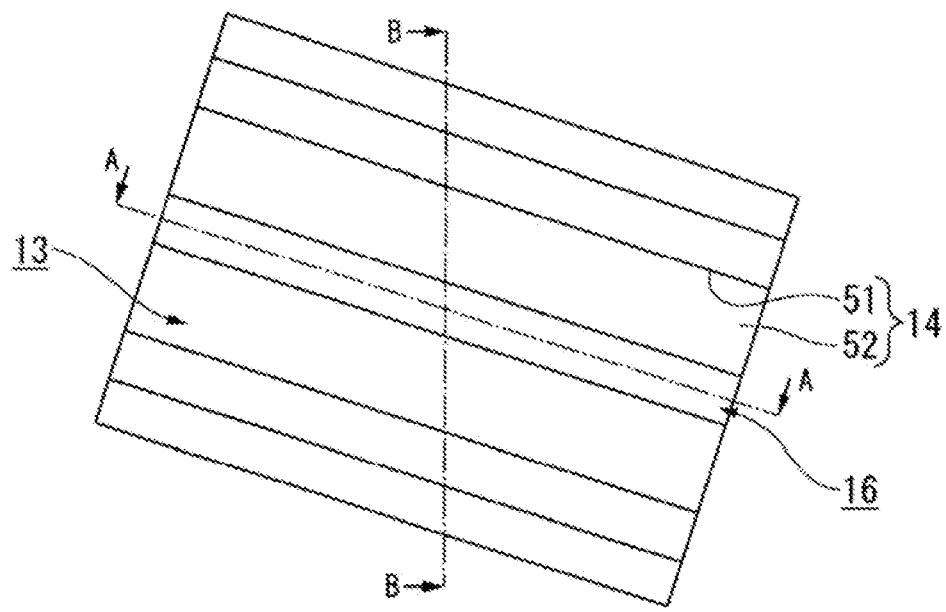
FIG. 4A is a plane view of a region where a memory cell array is formed, showing a production process (Part 2) of a memory cell array that the semiconductor device described in FIG. 1 has.
Figure 4B:
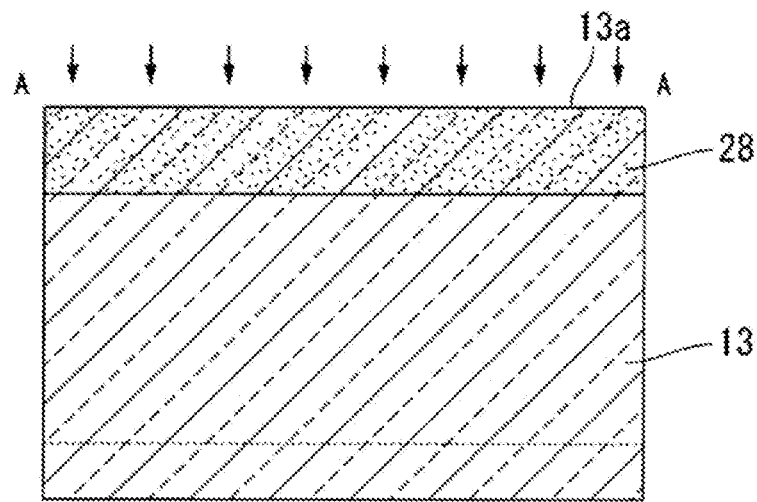
FIG. 4B is a cross-sectional view of a semiconductor device taken along line A-A of FIG. 4A.
Figure 4C:
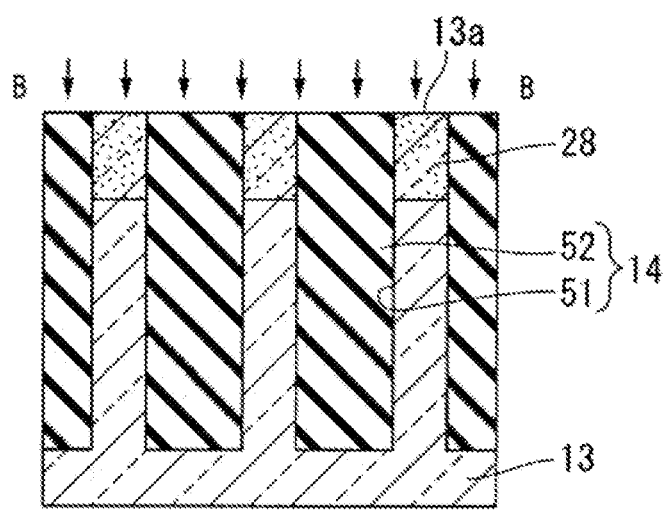
FIG. 4C is a cross-sectional view of a semiconductor device taken along line B-B of FIG. 4A.
Figure 5A:
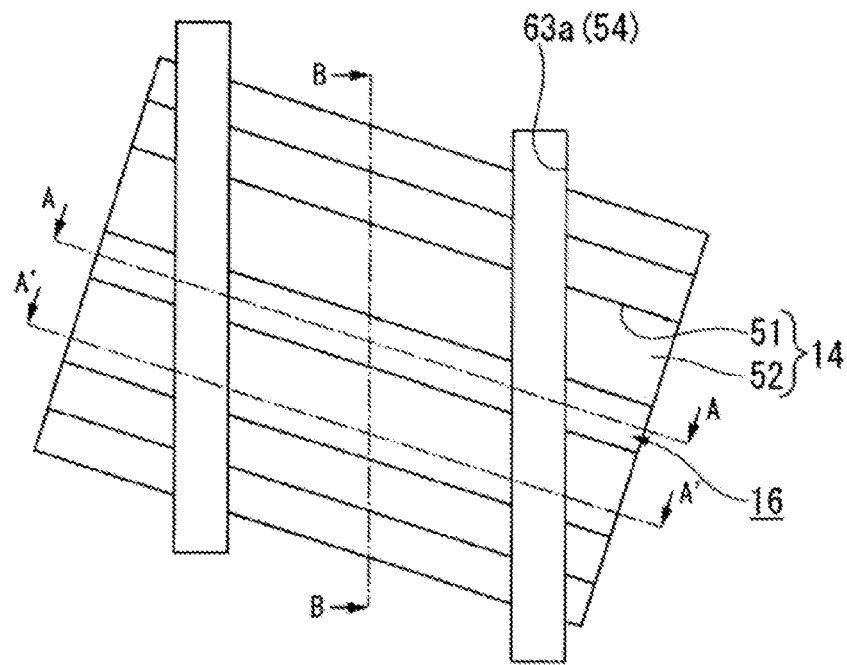
FIG. 5A is a plane view of a region where a memory cell array is formed, showing a production process (Part 3) of a memory cell array that the semiconductor device described in FIG. 1 has.
Figure 5B:
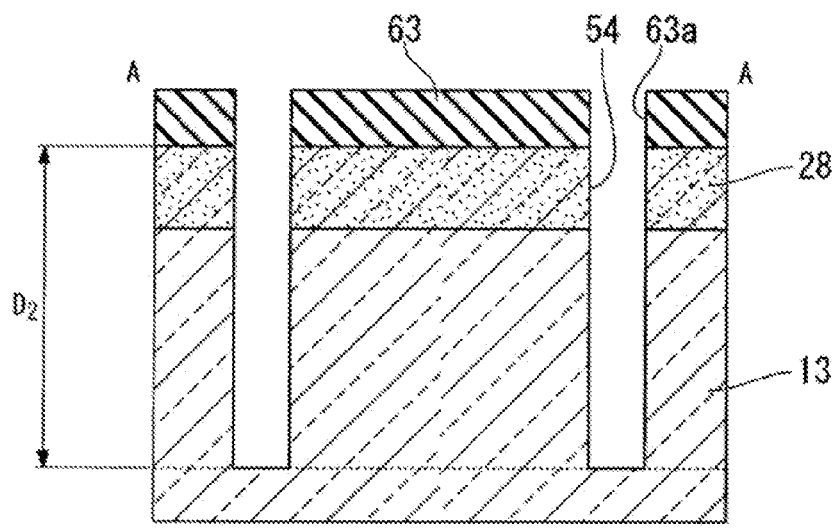
FIG. 5B is a cross-sectional view of a semiconductor device taken along line A-A of FIG. 5A.
Figure 5C:
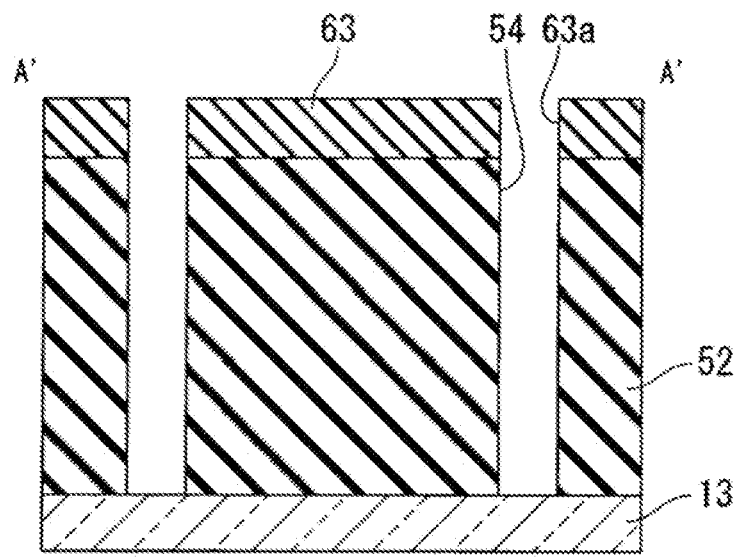
FIG. 5C is a cross-sectional view of a semiconductor device taken along line A'-A' of FIG. 5A.
Figure 5D:
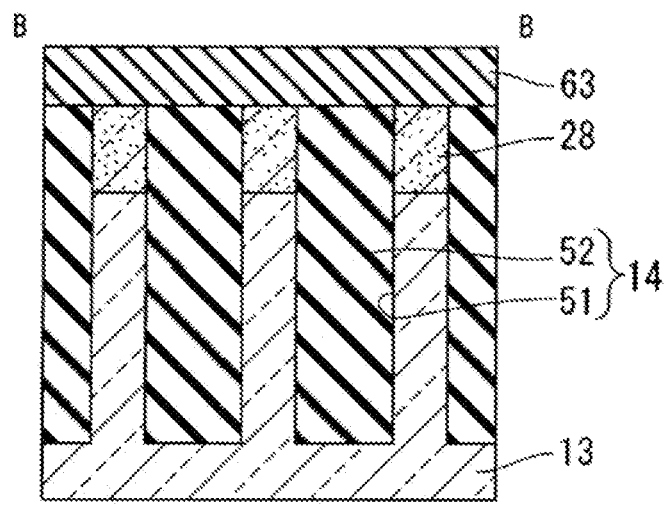
FIG. 5D is a cross-sectional view of a semiconductor device taken along line B-B of FIG. 5A.
Figure 6A:
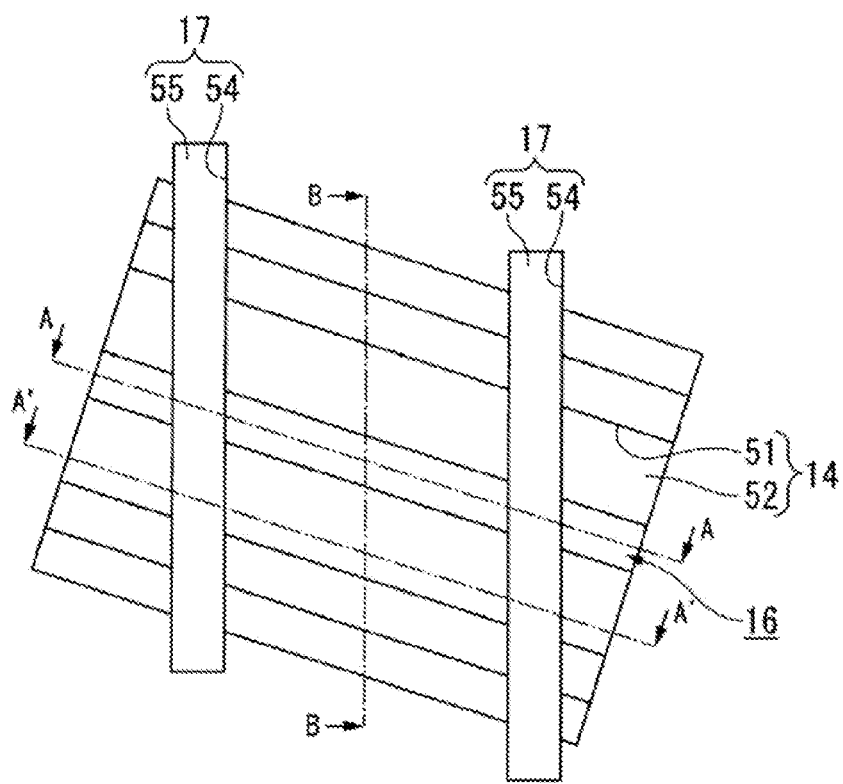
FIG. 6A is a plane view of a region where a memory cell array is formed, showing a production process (Part 4) of a memory cell array that the semiconductor device described in FIG. 1 has.
Figure 6B:
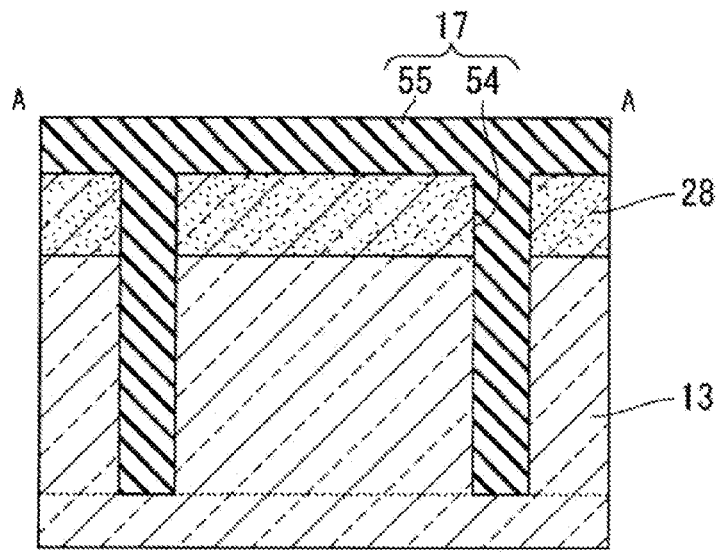
FIG. 6B is a cross-sectional view of a semiconductor device taken along line A-A of FIG. 6A.
Figure 6C:
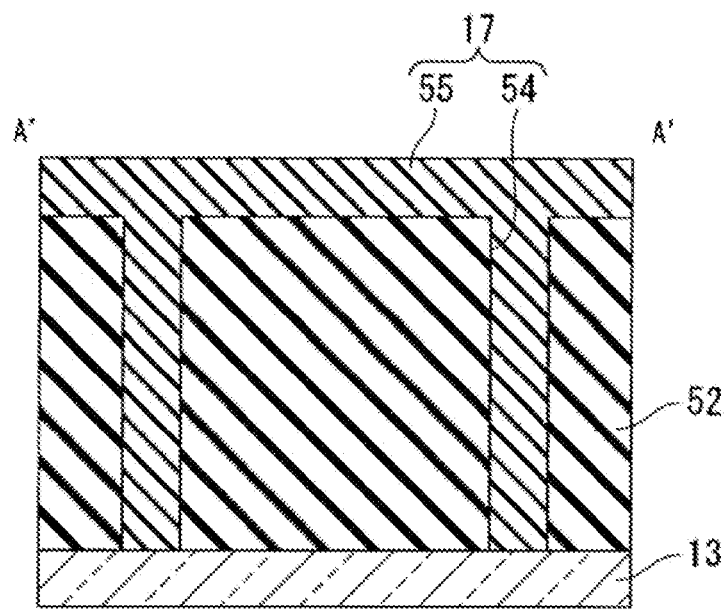
FIG. 6C is a cross-sectional view of a semiconductor device taken along line A'-A' of FIG. 6A.
Figure 6D:
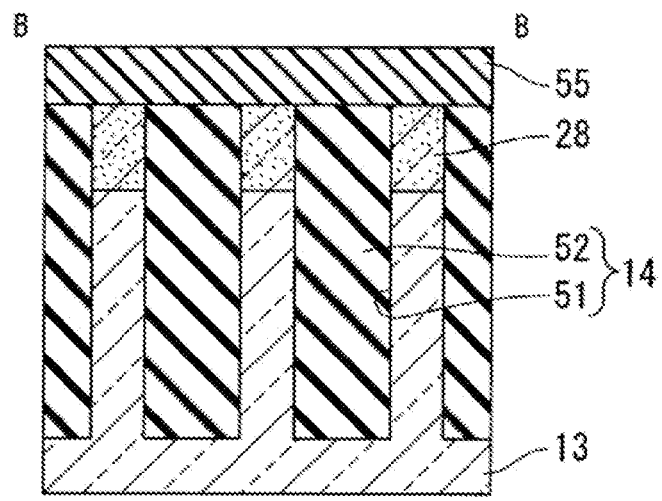
FIG. 6D is a cross-sectional view of a semiconductor device taken along line B-B of FIG. 6A.

Then, an entire upper surface of a structure shown in FIGS. 4A to 4C is ion-implanted with phosphorus (P), which is a n-type impurity (or an impurity of a different conductivity type from a p-type silicon substrate that is used for the semiconductor substrate 13) with an energy of 100 KeV and a dose of $1\times10^{14}$ atmos/cm$^2$. In this manner, on the main surface 13a of the semiconductor substrate 13, an impurity diffusion region, which is later turned into a first impurity diffusion region 28, is formed. The ion implantation at this time is so controlled that the position of a bottom face of the first impurity diffusion region 28 will be higher than an upper surface 22a of a gate electrode 22, which is formed later.

Then, as shown in FIGS. 5A to 5D, on the main surface 13a of the semiconductor substrate 13, a photoresist 63 having a plurality of groove-shaped openings 63a is formed. The openings 63a each are so formed as to extend in the shape of a strip in the Y-direction (first direction), and are disposed at predetermined intervals in the X-direction. Then, by using the photoresist 63 having the openings 63a as a mask, anisotropic etching (or more specifically, dry etching) is carried out to perform etching of the semiconductor substrate 13. As a result, a second element isolation trench 54 is so formed as to extend in the first direction. For example, it is preferred that depth D2 of the second element isolation trench 54 (which is a depth that is measured with respect to the main surface 13a of the semiconductor substrate 13) be 250 nm, i.e. depth D2 of the second element isolation trench 54 be equal to depth D1 of the first element isolation trench 51. The photoresist 63 is removed after the second element isolation trench 54 is formed.

Then, as shown in FIGS. 6A to 6D, a second element isolation insulation film 55, which is embedded in the second element isolation trench 54, is formed. More specifically, the HDP or SOG method is used to form a silicon dioxide film (SiO$_2$ film) in such a way that the silicon dioxide film is embedded in the second element isolation trench 54, thereby creating a second element isolation insulating film 55. As a result, second element isolation regions 17, which are designed to partition a strip-shaped active region 16 into a plurality of element formation regions R, are formed. After that, the CMP method is used to flatten the surface, thereby obtaining a situation where the entire surface is covered with a silicon dioxide film with a certain film thickness.

Figure 7A:
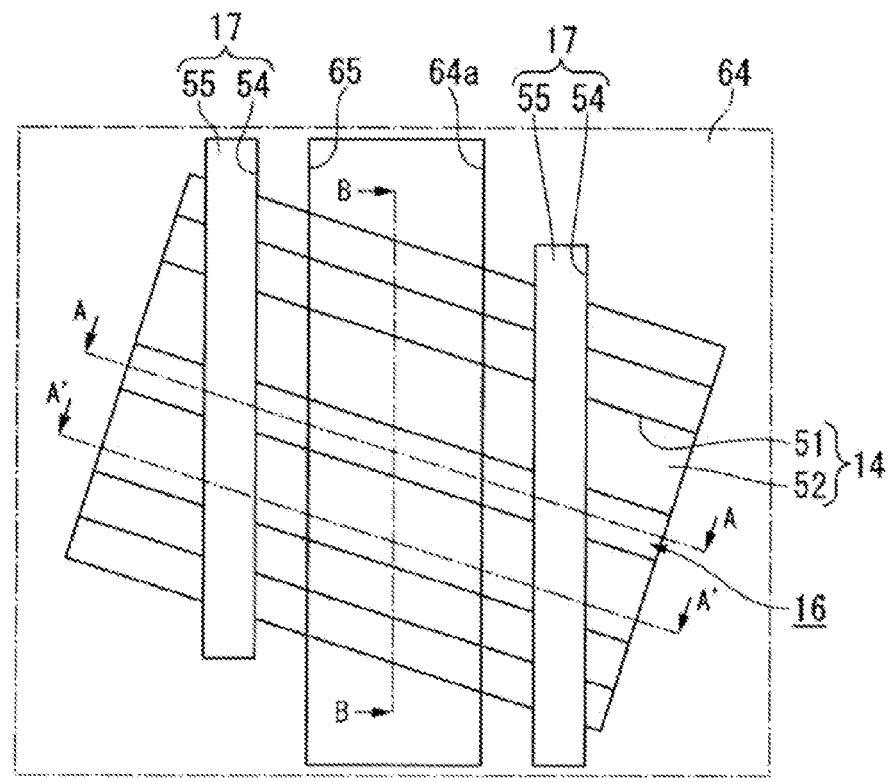
FIG. 7A is a plane view of a region where a memory cell array is formed, showing a production process (Part 5) of a memory cell array that the semiconductor device described in FIG. 1 has.
Figure 7B:
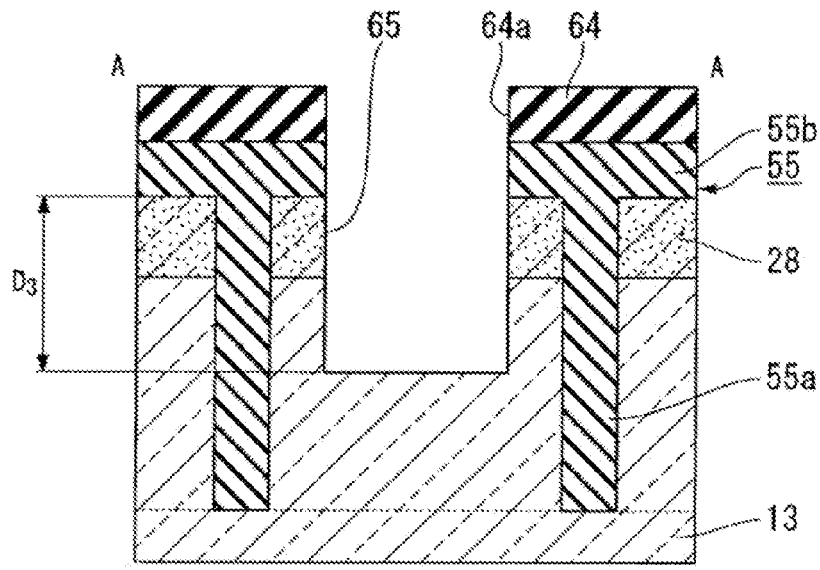
FIG. 7B is a cross-sectional view of a semiconductor device taken along line A-A of FIG. 7A.
Figure 7C:
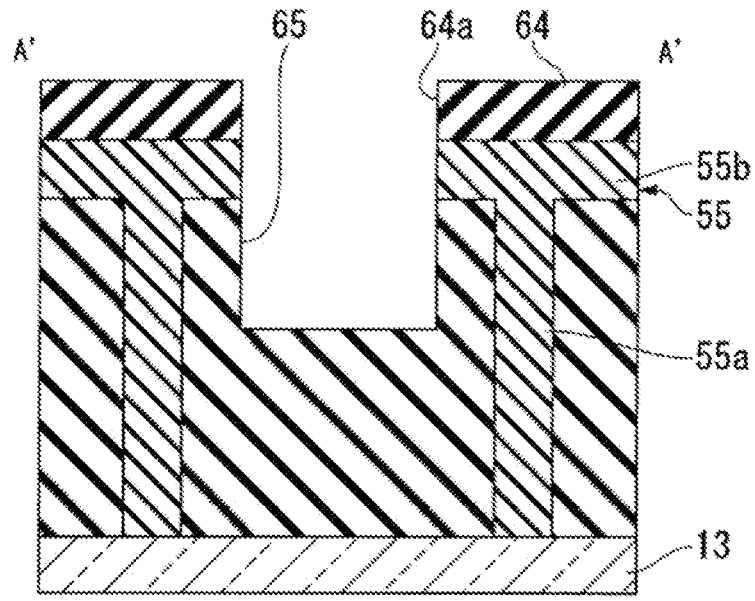
FIG. 7C is a cross-sectional view of a semiconductor device taken along line A'-A' of FIG. 7A.

Then, as shown in FIGS. 7A to 7D, a photoresist 64 that has an opening 64a extending in the first direction is formed. The opening 64a is provided in a region between two adjacent second element isolation regions 17. Then, by using the photoresist 64 as a mask, anisotropic etching (or more specifically, dry etching) is carried out to perform etching of the semiconductor substrate 13. As a result, a gate-electrode trench 65 is so formed as to extend in the first direction. As shown in FIG. 7A, the gate-electrode trench 65 is formed between two adjacent second element isolation regions 17. The gate-electrode trench 65 formed at this stage is a wide trench whose shape is such that two completion-stage gate-electrode trenches 18 and a region sandwiched between the gate-electrode trenches 18 are engraved at once. Depth D3 of the gate-electrode trench 65 is shallower than depth of the first and second element isolation trenches 51 and 52. For example, it is preferred that depth D3 be 150 nm. After the gate-electrode trench 65 is formed, as shown in FIGS. 8A to 8D, the photoresist 64, which is used to form the gate-electrode trench 65, is removed.

Figure 7D:
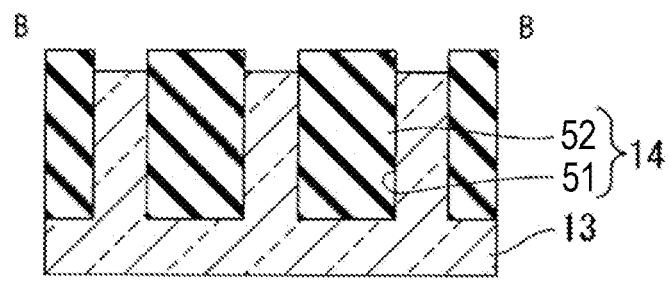
FIG. 7D is a cross-sectional view of a semiconductor device taken along line B-B of FIG. 7A.
Figure 8A:
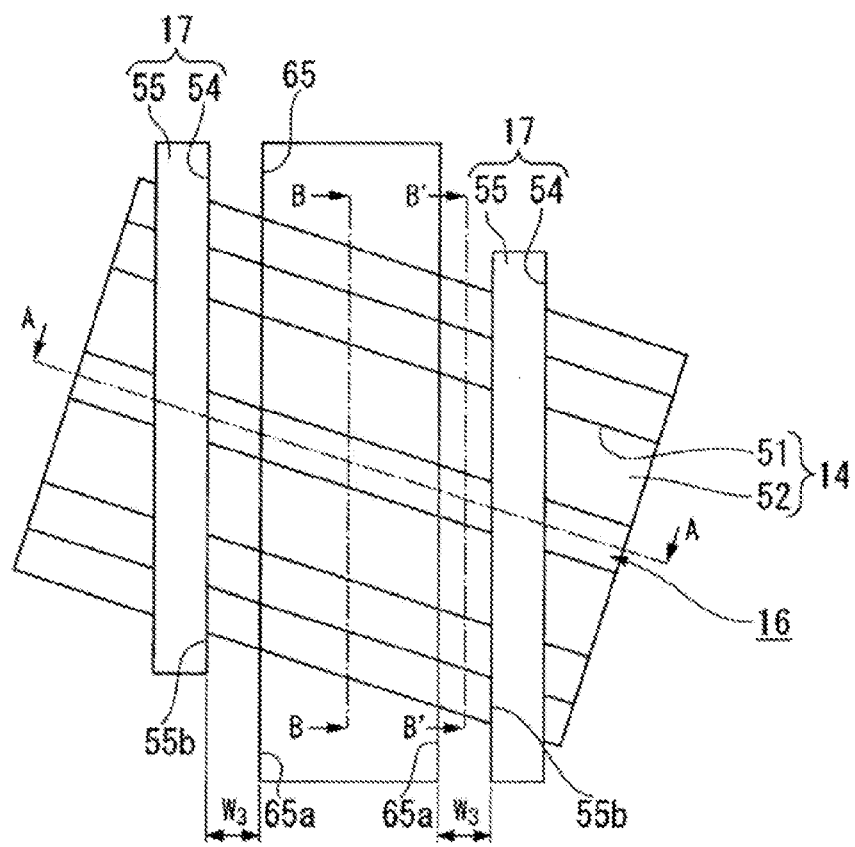
FIG. 8A is a plane view of a region where a memory cell array is formed, showing a production process (Part 6) of a memory cell array that the semiconductor device described in FIG. 1 has.
Figure 8B:
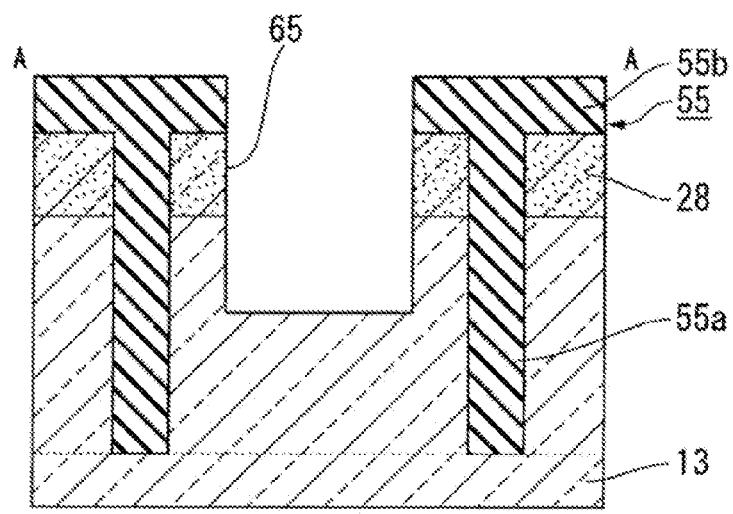
FIG. 8B is a cross-sectional view of a semiconductor device taken along line A-A of FIG. 8A.
Figure 8C:
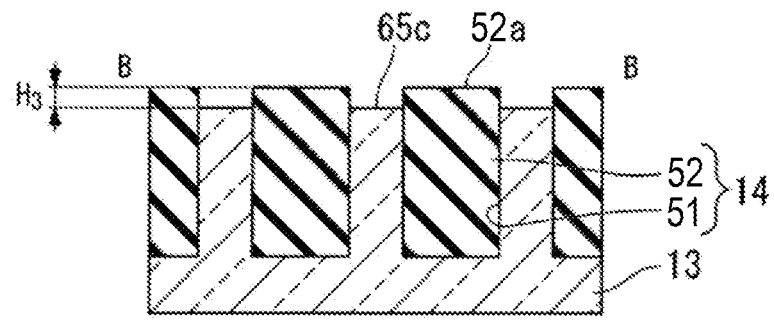
FIG. 8C is a cross-sectional view of a semiconductor device taken along line B-B of FIG. 8A.
Figure 8D:
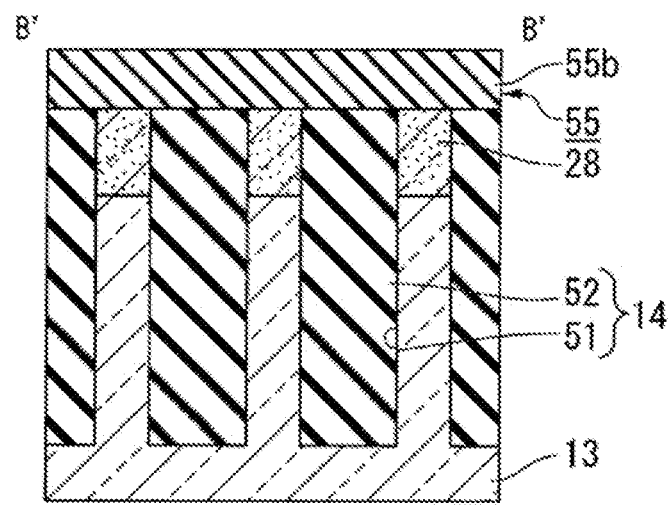
FIG. 8D is a cross-sectional view of a semiconductor device taken along line B'-B' of FIG. 8A.

In forming the gate-electrode trench 65, the semiconductor substrate 13, which is made of silicon, and the first element isolation insulation film 52, which is made from a silicon nitride film, are simultaneously etched. By using conditions under which an etching rate of silicon is different from that of the silicon nitride film, the etching depths can differ from each other. With the use of the property, according to the present embodiment, as shown in FIGS. 7D and 8C, on the bottom face 65c of the gate electrode trench 65, the upper surface 52a of the first element isolation insulation film 52 is positioned above the surface of the semiconductor substrate 13. That is, the first element isolation insulation film 52 protrudes upwards from the bottom face 65c. According to the present embodiment, the protruding height $H_3$ of the first element isolation insulation film 52 shown in FIG. 8C from the bottom face 65c is substantially equal to the distance $W_3$ from the side face 65a of the gate-electrode trench 65 shown in FIG. 8A to the side face 55b of the second element isolation insulation film 55, for example.

Then, as shown in FIGS. 9A to 9E, the first element isolation insulation film 52 that is partially exposed from an inner face of the gate-electrode trench 65 is etched. Before the etching, from the inner face of the gate-electrode trench 65, in addition to the first element isolation insulation film 52 that is a silicon nitride film, the following, too, are exposed: the semiconductor substrate 13, which is made of silicon, and the second element isolation insulation film 55, which is a silicon dioxide film. In this case, it is necessary to etch only the first element isolation insulation film 52, not the semiconductor substrate 13 and the second element isolation insulation film 55. Therefore, an etching solution that can selectively etch the first element isolation insulation film 52, which is made from a silicon nitride film, such as heated phosphoric acid, is used to carry out wet etching. If heated phosphoric acid is used as an etching solution, etching selectivity of a silicon nitride film and a silicon dioxide film is about 100:1, for example.

Figure 9A:
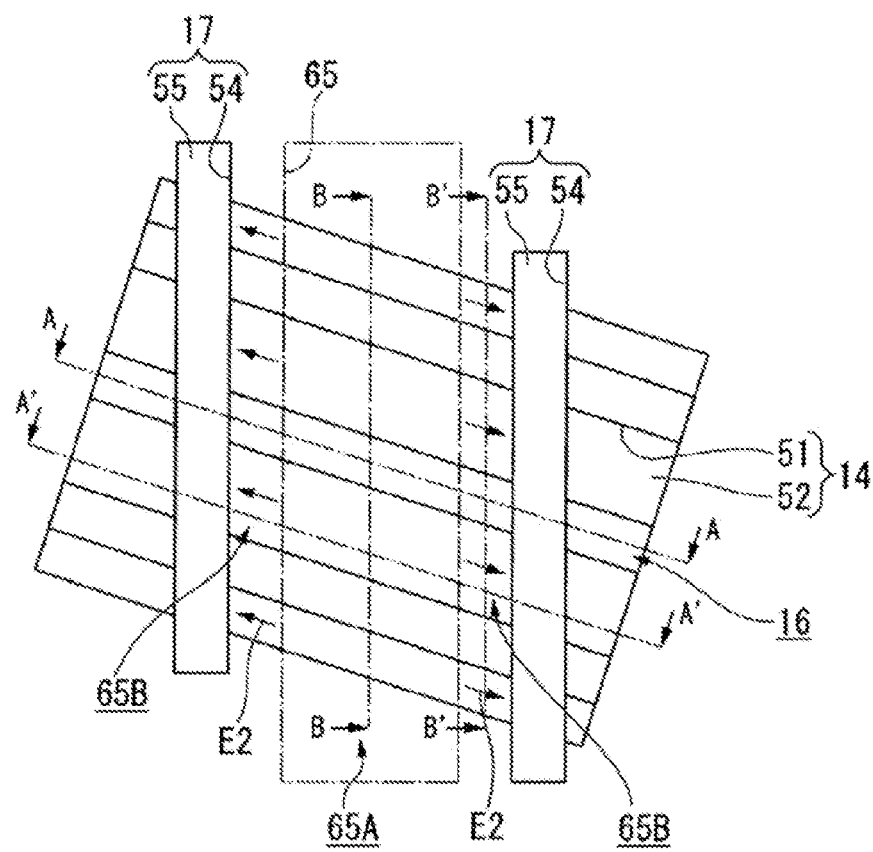
FIG. 9A is a plane view of a region where a memory cell array is formed, showing a production process (Part 7) of a memory cell array that the semiconductor device described in FIG. 1 has.
Figure 9B:
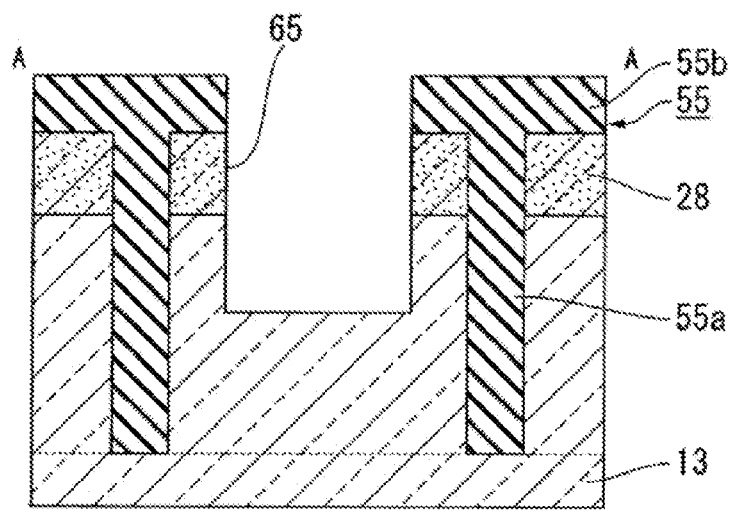
FIG. 9B is a cross-sectional view of a semiconductor device taken along line A-A of FIG. 9A.
Figure 9C:
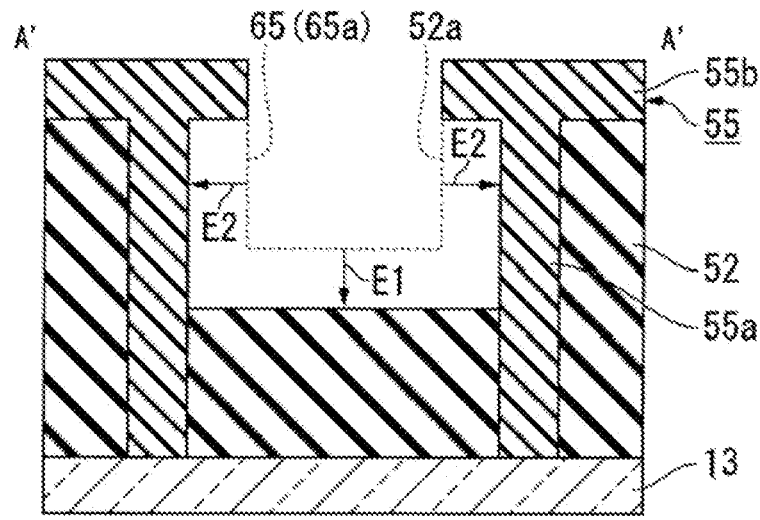
FIG. 9C is a cross-sectional view of a semiconductor device taken along line A'-A' of FIG. 9A.
Figure 9D:
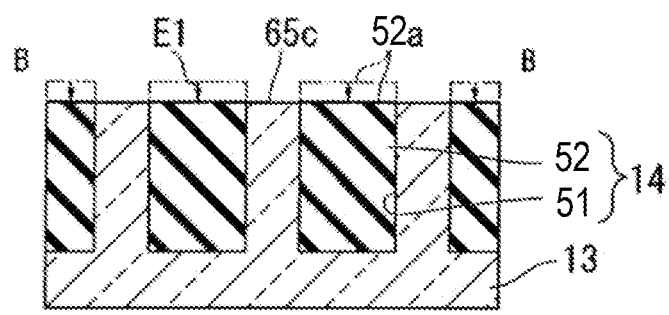
FIG. 9D is a cross-sectional view of a semiconductor device taken along line B-B of FIG. 9A.
Figure 9E:
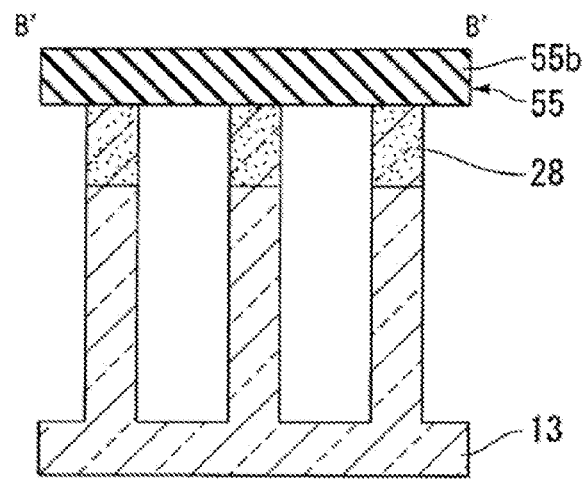
FIG. 9E is a cross-sectional view of a semiconductor device taken along line B'-B' of FIG. 9A.

In the etching, as indicated by arrow E1 in FIG. 9D, etching proceeds in a vertical direction from the upper surface 52a of the first element isolation insulation film 52, which protrudes upwards from the bottom face 65c of the gate-electrode trench 65; an upper end of the first element isolation insulation film 52 is etched. At the same time, the etching proceeds isotropically. Therefore, as indicated by arrow E2 in FIGS. 9A and 9C, the etching also proceeds in a horizontal direction from the side face 52a of the first element isolation insulation film 52, which is exposed from the side face 65a of the gate-electrode trench 65.

The second element isolation insulation film 55 is a silicon dioxide film. Therefore, the etching that proceeds in the horizontal direction stops after reaching the second element isolation insulation film 55. As for the vertical-direction etching, as described above, because the protruding height $H_3$ (FIG. 8C) of the first element isolation insulation film 52 from the bottom face 65c is substantially equal to the distance $W_3$ (FIG. 8A) from the side face 65a of the gate-electrode trench 65 to the side face 55b of the second element isolation insulation film 55, the upper surface 52a of the first element isolation insulation film 52 can be flush with the bottom face 65c of the gate-electrode trench 65 if the etching is stopped at a timing when the horizontal-direction etching is stopped. Incidentally, in FIGS. 9C and 9D, an outer shape of the first element isolation insulation film 52 before the etching is indicated by dashed line or two-dot chain line; the directions in which the etching proceeds are indicated by arrows E1 and E2. In that manner, the gate-electrode trench 65 is formed: the gate-electrode trench 65 has the first trench portion 65A, which extends in the first direction, and the second trench portion 65B, which diverges from the first trench portion 65A and extends in the second direction.

Figure 10A:
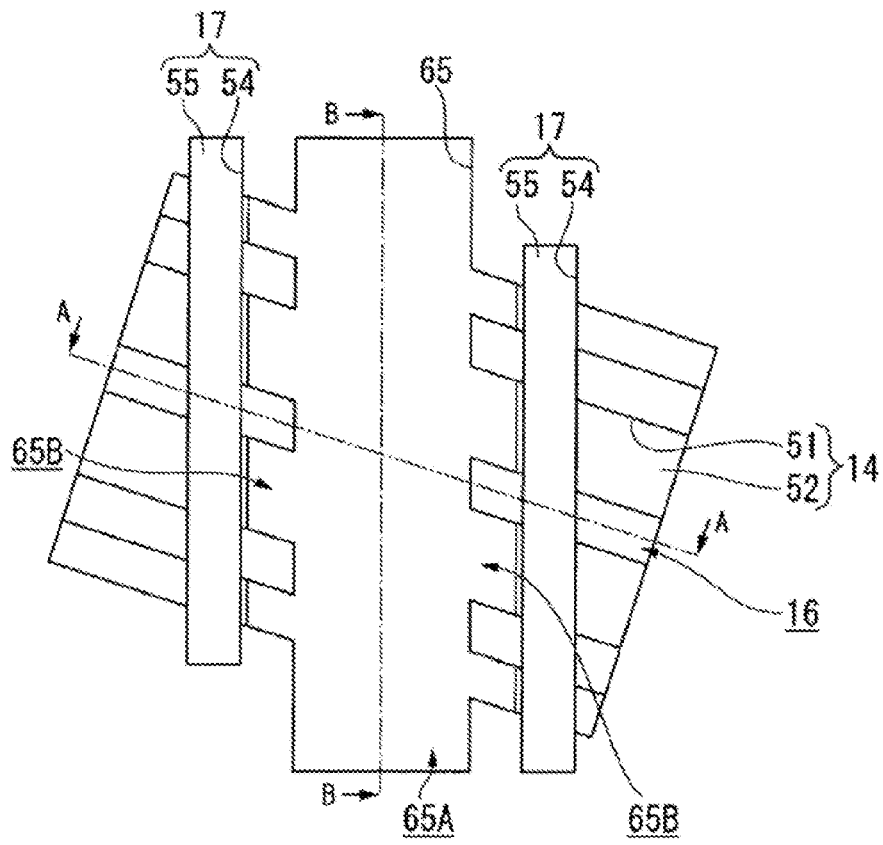
FIG. 10A is a plane view of a region where a memory cell array is formed, showing a production process (Part 8) of a memory cell array that the semiconductor device described in FIG. 1 has.
Figure 10B:
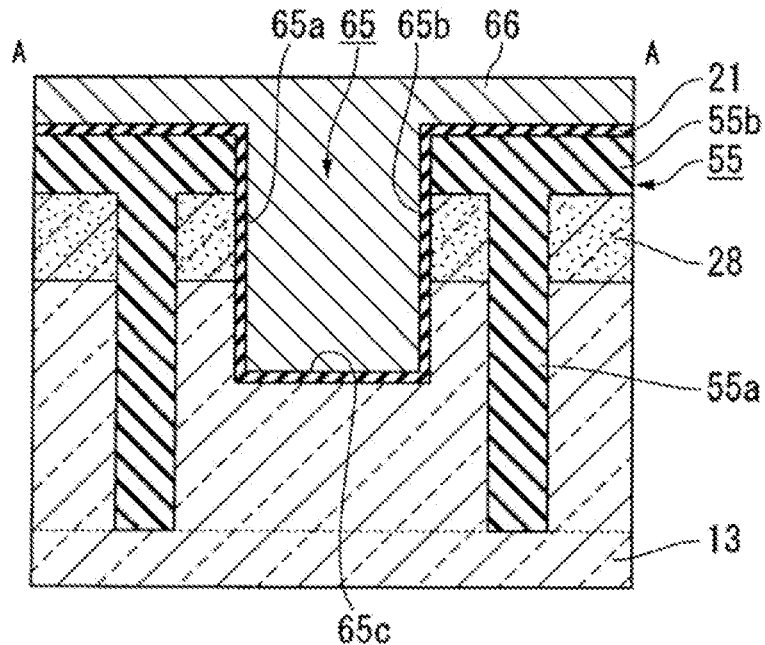
FIG. 10B is a cross-sectional view of a semiconductor device taken along line A-A of FIG. 10A.
Figure 10C:
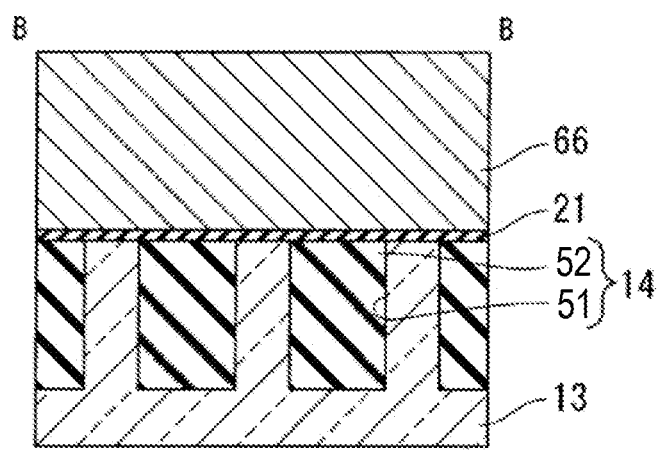
FIG. 10C is a cross-sectional view of a semiconductor device taken along line B-B of FIG. 10A.

Then, as shown in FIGS. 10A to 10C, a gate insulation film 21 is formed so as to cover inner surfaces of the gate-electrode trench 65 (including two side faces 65a and 65b, and a bottom face 65c). For the gate insulation film 21, for example, the following films are preferably used: a single-layer silicon dioxide film ($SiO_2$ film); a film that is obtained by nitriding of the silicon dioxide film (SiON film); a stacked silicon dioxide film ($SiO_2$ film); and a stacked film that is made by stacking a silicon nitride film (SiN film) on a silicon dioxide film ($SiO_2$ film). If a single-layer silicon dioxide film ($SiO_2$ film) is used as the gate insulation film 21, the gate insulation film 21 is preferably formed by thermal oxidation method, for example. In this case, the thickness of the gate insulation film 21 is preferably 6 nm, for example. The following explanation is given under the premise that the gate insulation film 21 is a single-layer silicon dioxide film.

Then, a conductive material film 66, which is later turned into a gate electrode 22, is formed across the entire surface. The amount of the conductive material film 66 formed is so set that an inner space of the gate-electrode trench 65 is completely filled with the conductive material film 66 through the gate insulation film 21. More specifically, for example, the CVD method is preferably used to sequentially stack a titanium nitride film and a tungsten film, thereby forming the conductive material film 66.

Figure 11A:
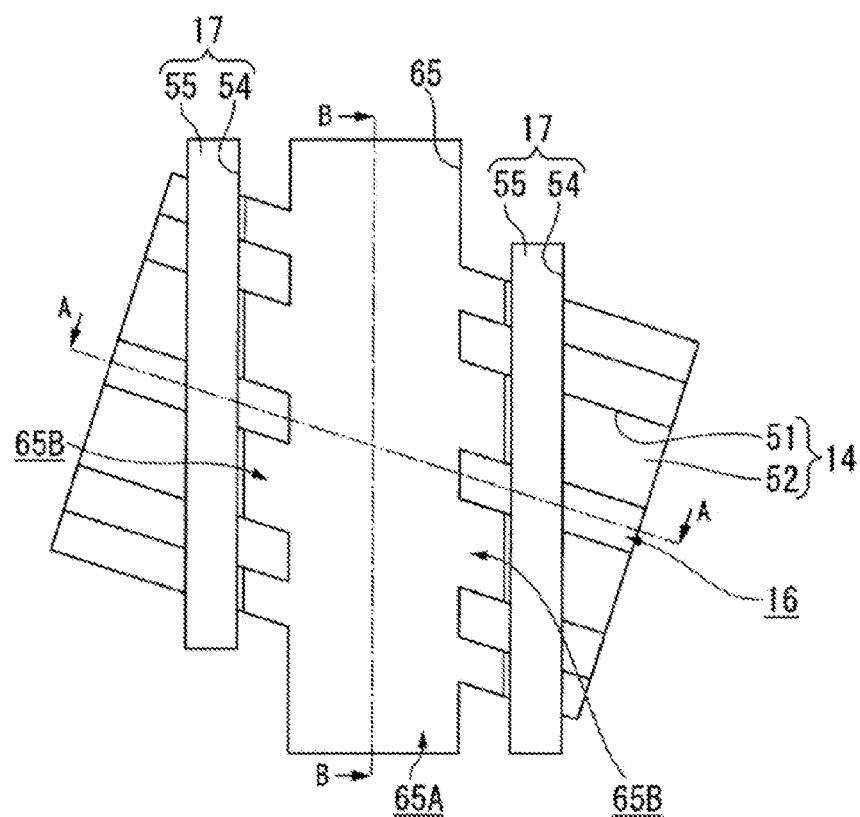
FIG. 11A is a plane view of a region where a memory cell array is formed, showing a production process (Part 9) of a memory cell array that the semiconductor device described in FIG. 1 has.
Figure 11B:
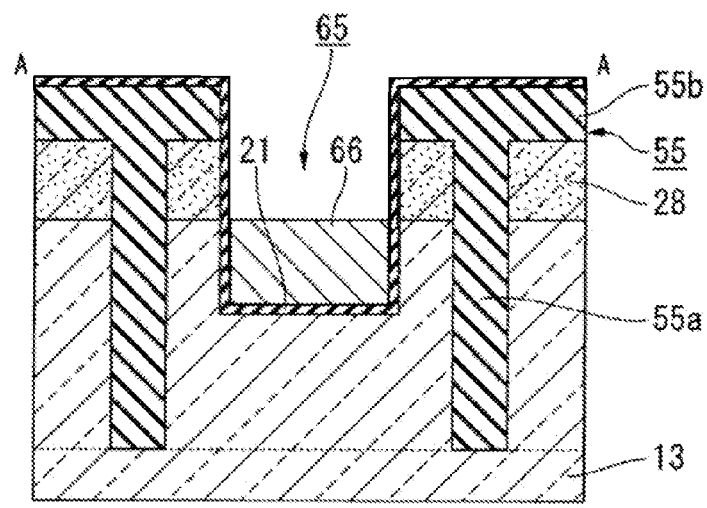
FIG. 11B is a cross-sectional view of a semiconductor device taken along line A-A of FIG. 11A.
Figure 11C:
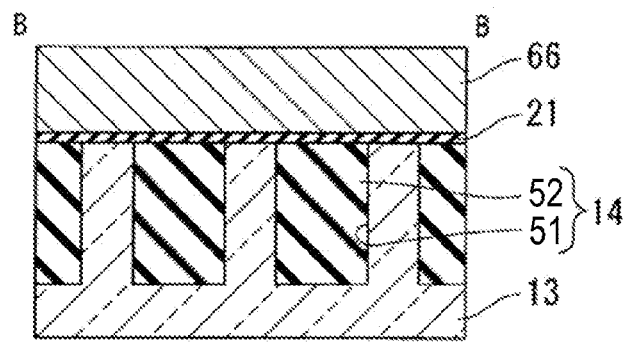
FIG. 11C is a cross-sectional view of a semiconductor device taken along line B-B of FIG. 11A.

Then, as shown in FIGS. 11A to 11C, dry etching is used to carry out etching-back of an entire surface of the conductive material film 66. The etching-back is carried out in such a way that the conductive material film 66 remains in a lower portion of the gate-electrode trench 65, and an upper surface of the remaining conductive material film 66 is positioned at a lower position than the bottom face of the first impurity diffusion region 28. After this dry etching, as shown in FIG. 11B, the gate insulation film 21 remains not only between the conductive material film 66 and the semiconductor substrate 13 but also on the first impurity diffusion region 28 and the second element isolation insulation film 55.

Figure 12A:
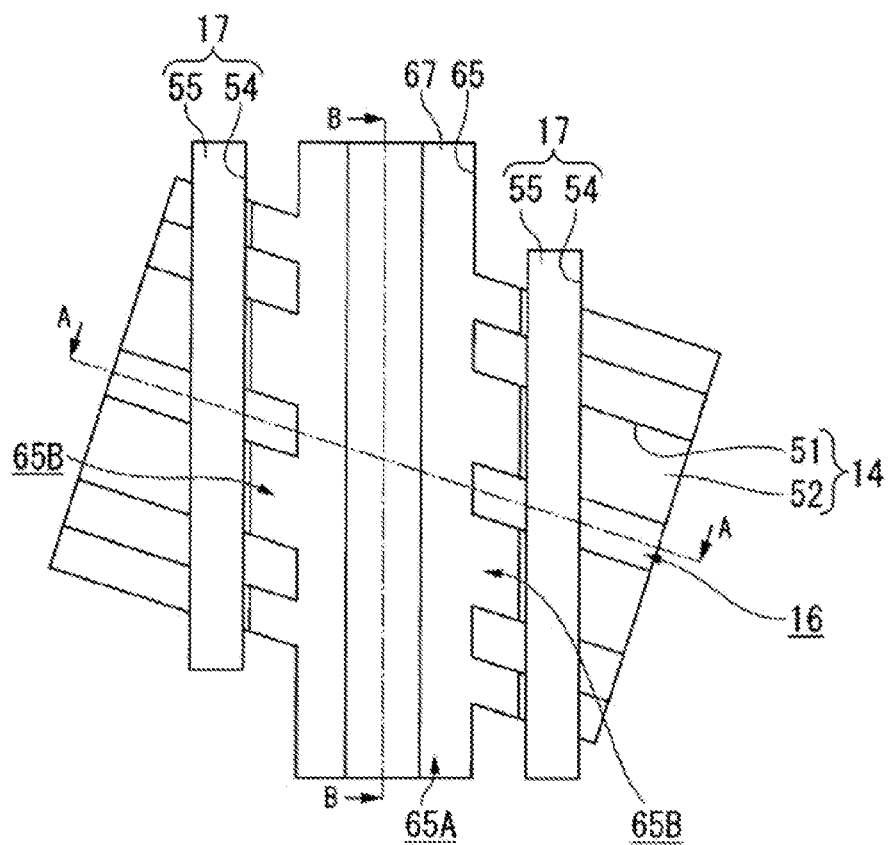
FIG. 12A is a plane view of a region where a memory cell array is formed, showing a production process (Part 10) of a memory cell array that the semiconductor device described in FIG. 1 has.
Figure 12B:
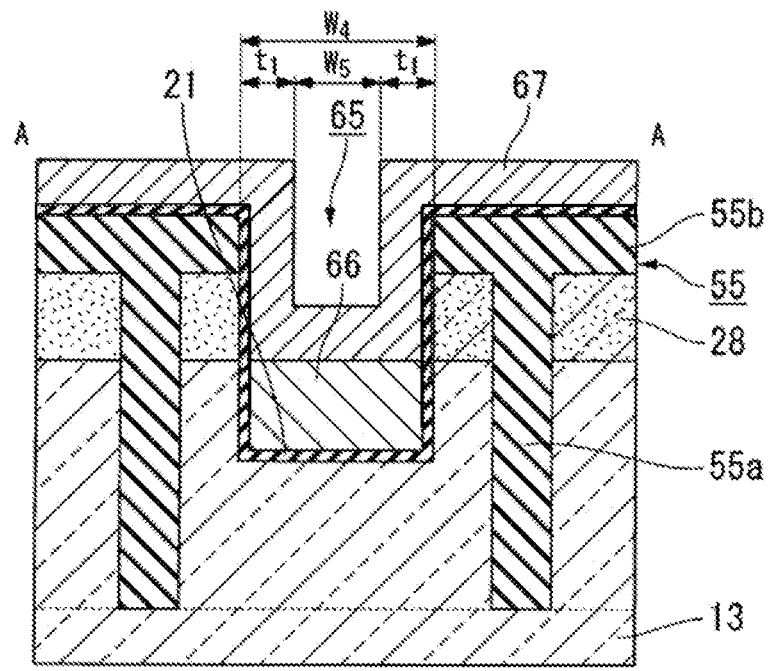
FIG. 12B is a cross-sectional view of a semiconductor device taken along line A-A of FIG. 12A.
Figure 12C:
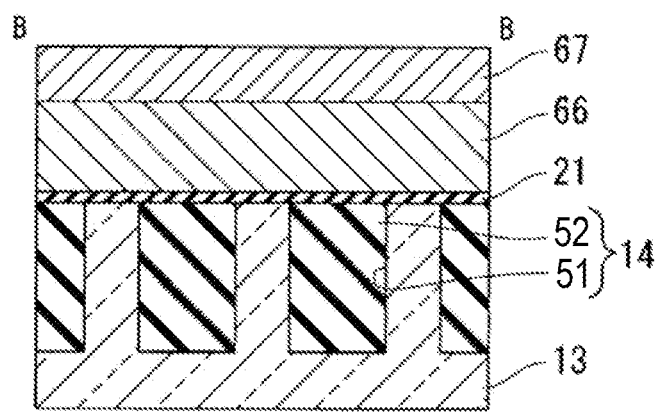
FIG. 12C is a cross-sectional view of a semiconductor device taken along line B-B of FIG. 12A.

Then, as shown in FIGS. 12A to 12C, an insulation film 67 is so formed as to cover the upper surface 22a of the conductive material film 66, the side faces of the gate-electrode trench 65, and the upper surface of the second element isolation insulation film 55. The insulation film will become an embedded insulation film 24. More specifically, the HDP (High Density Plasma) method is used to form a silicon nitride film (SiN film), for example, thereby forming the insulation film 67. The conditions for formation of the insulation film 67 are so set that thickness $t_1$ of the insulation film 67 that is formed along the side faces of the gate-electrode trench 65 will be about one-third of width $W_4$ of the gate-electrode trench 65. As a result, width $W_5$ of a portion of the gate-electrode trench 65 in which the insulation film 67 is not embedded is about one-third of width $W_4$ of the gate-electrode trench 65.

Incidentally, FIG. 12A shows only a portion of the insulation film 67 that is formed into a sidewall shape on the inner side faces of the gate-electrode trench 65. As shown in the diagram, the sidewall-shaped insulation film 67 is formed along each of the inner side faces of the first trench portion 65A and the second trench portion 65B. The sidewall-shaped insulation film 67 is also formed on a Y-direction inner side face of the first trench portion 65A. However, only one Y-direction portion of the gate-electrode trench 65 is shown in the diagram. Therefore, a portion that is formed on a Y-direction inner side face is not shown in the diagram. As shown in the diagram, in planar view, a portion that is formed on an inner side face of the second trench portion 65B fills the entire second trench portion 65B. The reason is that the maximum width of the second trench portion 65B is less than double the above $t_1$.

Figure 13A:
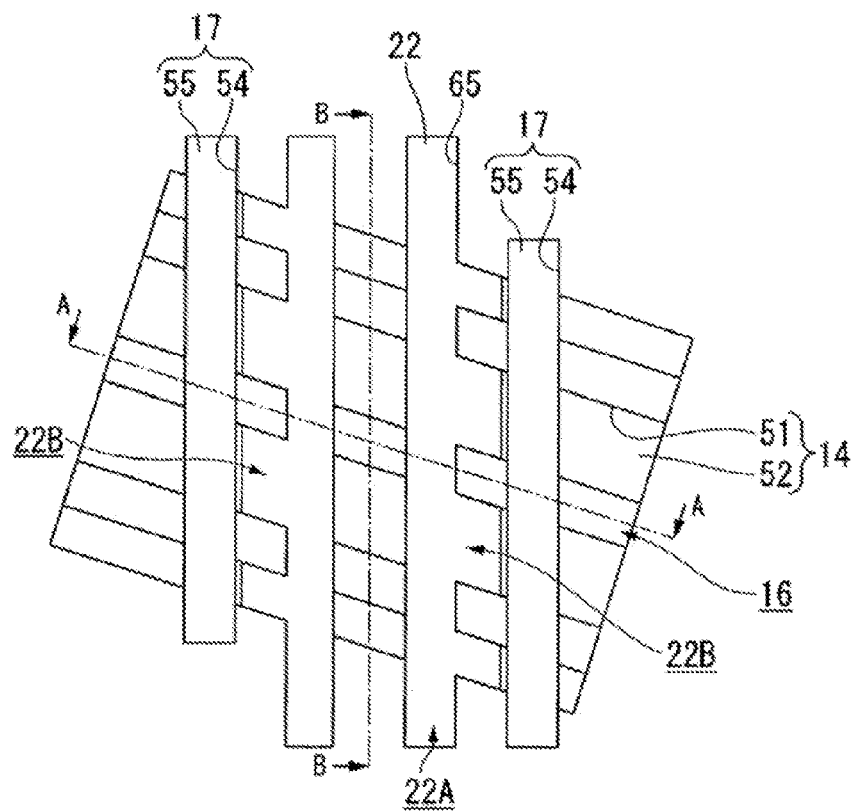
FIG. 13A is a plane view of a region where a memory cell array is formed, showing a production process (Part 11) of a memory cell array that the semiconductor device described in FIG. 1 has.
Figure 13B:
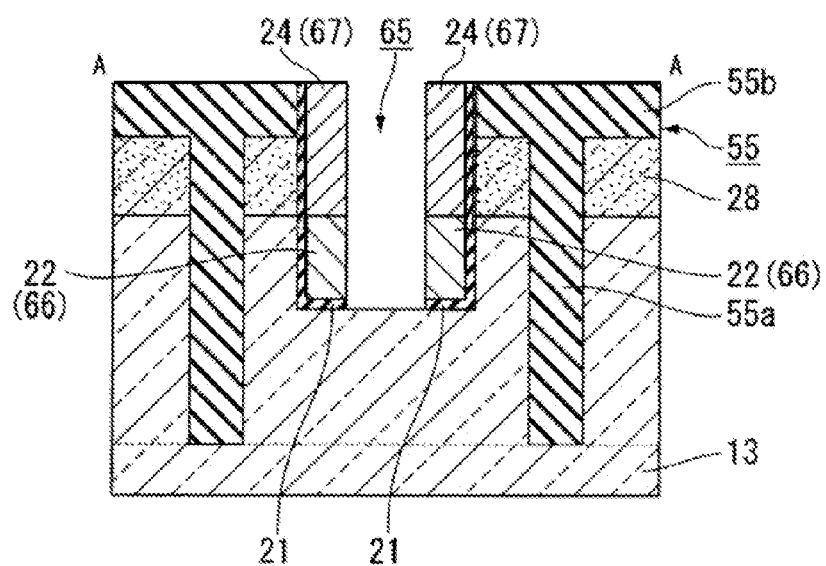
FIG. 13B is a cross-sectional view of a semiconductor device taken along line A-A of FIG. 13A.
Figure 13C:
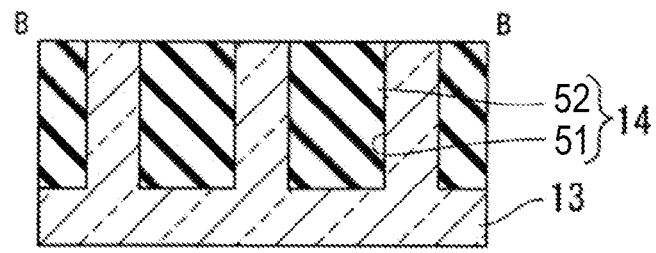
FIG. 13C is a cross-sectional view of a semiconductor device taken along line B-B of FIG. 13A.

Then, as shown in FIGS. 13A to 13C, dry etching is used to perform etching-back of an entire surface of the insulation film 67. As a result of the etching-back, the insulation film 67 remains only in a portion that goes along the inner side faces of the gate-electrode trench 65. The insulation film 67 is a silicon nitride film, and the second element isolation insulation film 55 is a silicon dioxide film. Therefore, the etching-back stops after reaching the second element isolation insulation film 55. Although not shown in the diagrams, at this time, another process needs to be carried out to separate a portion of the insulation film 67 that is formed along one X-direction inner side face of the first trench portion 65A from a portion of the insulation film 67 that is formed on the other inner side face. More specifically, a mask film that includes an opening designed to expose a portion of the sidewall-shaped insulation film 67 that is formed on a Y-direction inner side face of the first trench portion 65A is formed; and, by using the mask film as a mask, the insulation film 67 is etched. In this manner, it is possible to separate a portion of the insulation film 67 that is formed along one X-direction inner side face of the first trench portion 65A from a portion of the insulation film 67 that is formed on the other inner side face. The insulation film 67 remaining in an upper portion of a side face of the gate-electrode trench 65 will become an embedded insulation film 24.

Then, etching of the conductive material film 66 and the gate insulation film 21 that are embedded in a lower portion of the gate-electrode trench 65 is carried out. This etching is a anisotropic etching using the insulation film 67 remaining in an upper portion of a side face of the gate-electrode trench 65 as a mask. Therefore, the etching proceeds along a surface of the insulation film 67 remaining on an inner side face of the gate-electrode trench 65. As a result, the conductive material film 66 that is embedded in one gate-electrode trench 65 is divided into two portions, and gate electrodes 22, which are made of the conductive material film 66, are formed. The gate electrodes 22 constitute word lines of memory cells.

Figure 14A:
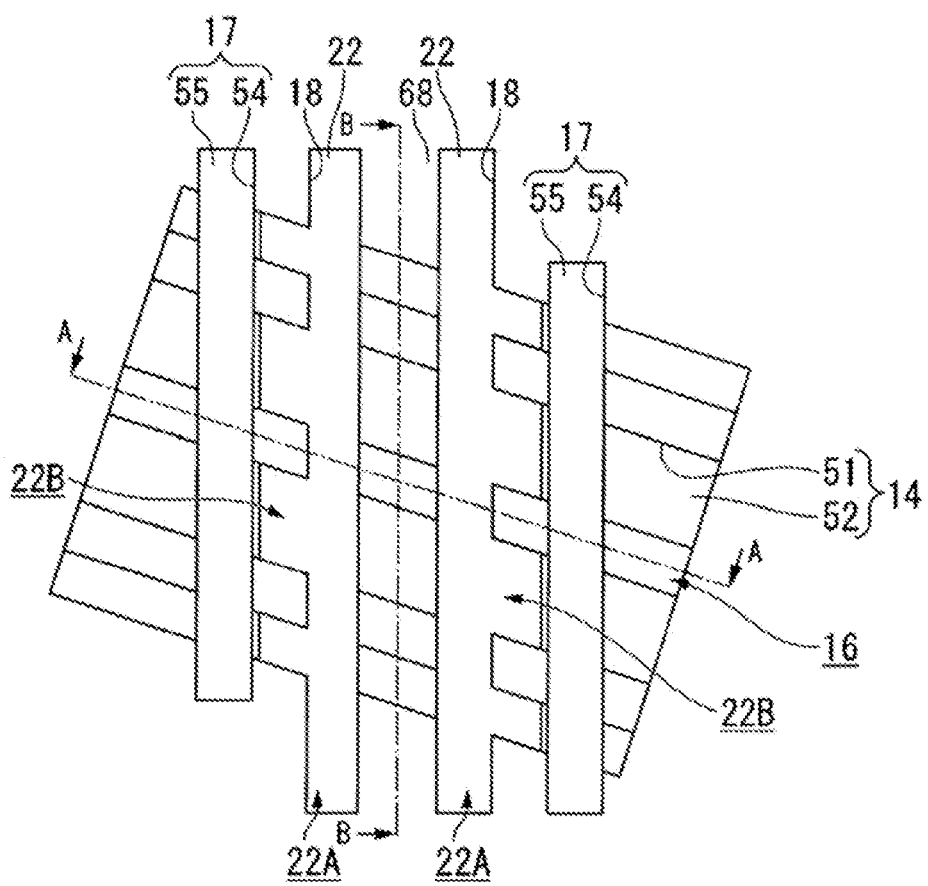
FIG. 14A is a plane view of a region where a memory cell array is formed, showing a production process (Part 12) of a memory cell array that the semiconductor device described in FIG. 1 has.
Figure 14B:
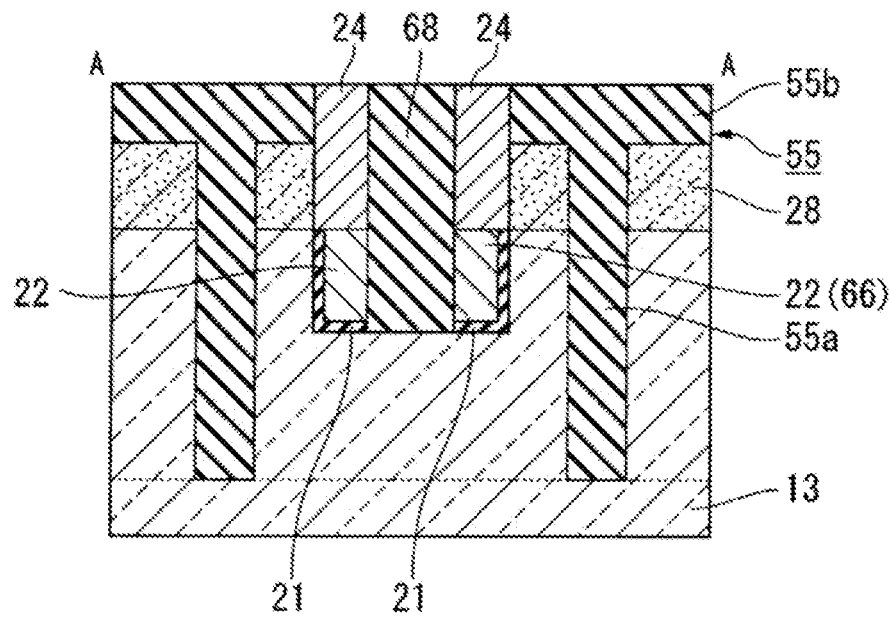
FIG. 14B is a cross-sectional view of a semiconductor device taken along line A-A of FIG. 14A.
Figure 14C:
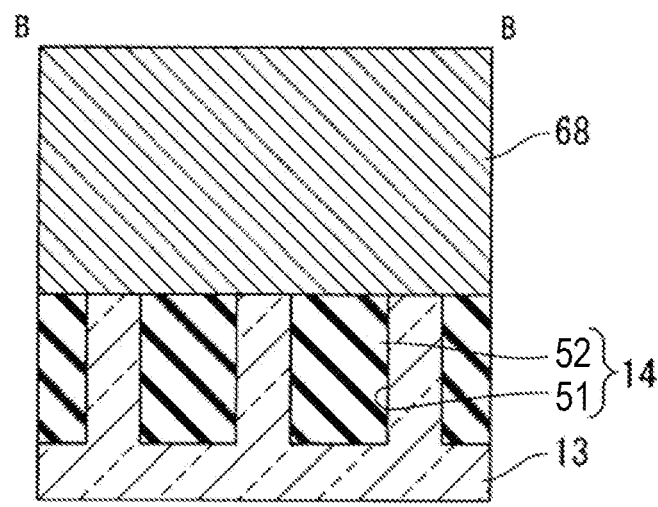
FIG. 14C is a cross-sectional view of a semiconductor device taken along line B-B of FIG. 14A.

Then, as shown in FIGS. 14A to 14C, an insulation film 68 is so formed as to be embedded in a region between the two divided gate electrodes 22 and between the embedded insulation films 24. More specifically, it is preferred that the HDP or SOG method be used to form a silicon dioxide film ($SiO_2$ film) in such a way that the silicon dioxide film is embedded in the above region inside the gate-electrode trench 65.

Figure 15A:
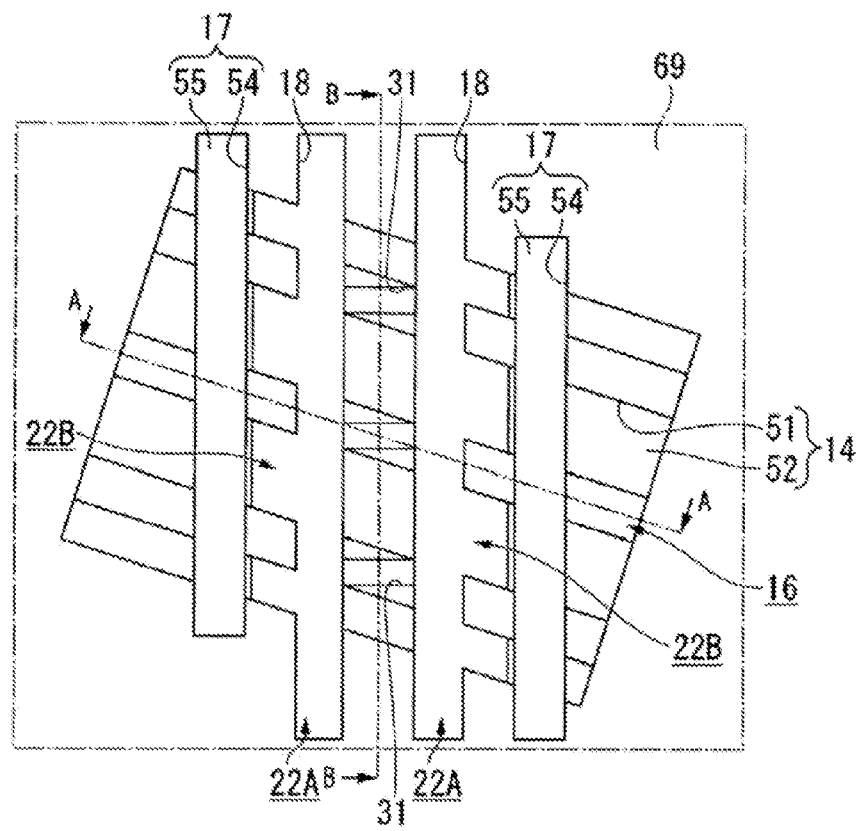
FIG. 15A is a plane view of a region where a memory cell array is formed, showing a production process (Part 13) of a memory cell array that the semiconductor device described in FIG. 1 has.
Figure 15B:
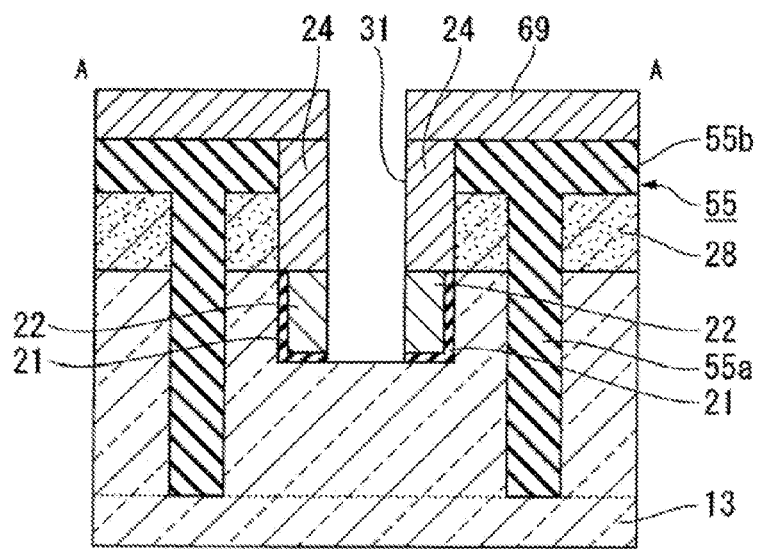
FIG. 15B is a cross-sectional view of a semiconductor device taken along line A-A of FIG. 15A.
Figure 15C:
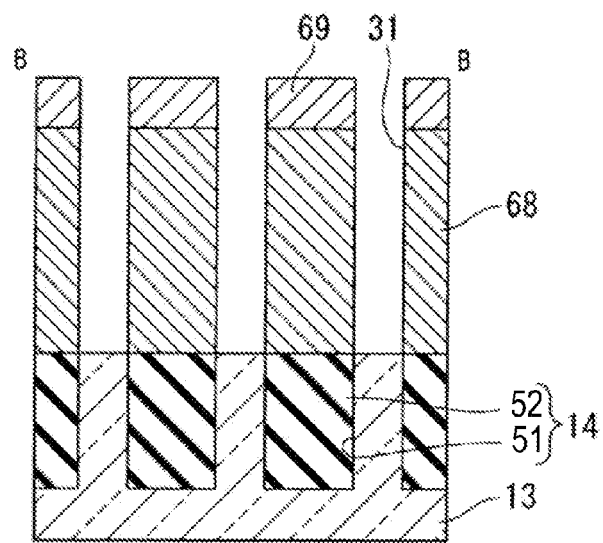
FIG. 15C is a cross-sectional view of a semiconductor device taken along line B-B of FIG. 15A.

Then, as shown in FIGS. 15A to 15C, a photoresist 69 for forming bit line contact holes 31 is formed. Then, by using the photoresist 69 as a mask, dry etching of the insulation film 68 is carried out. By the dry etching, only portions of the insulation film 68 where the bit line contact plugs 33 are later formed are removed. As a result, the bit line contact holes 31 are formed. Then, the photoresist 69 is removed.

Figure 16A:
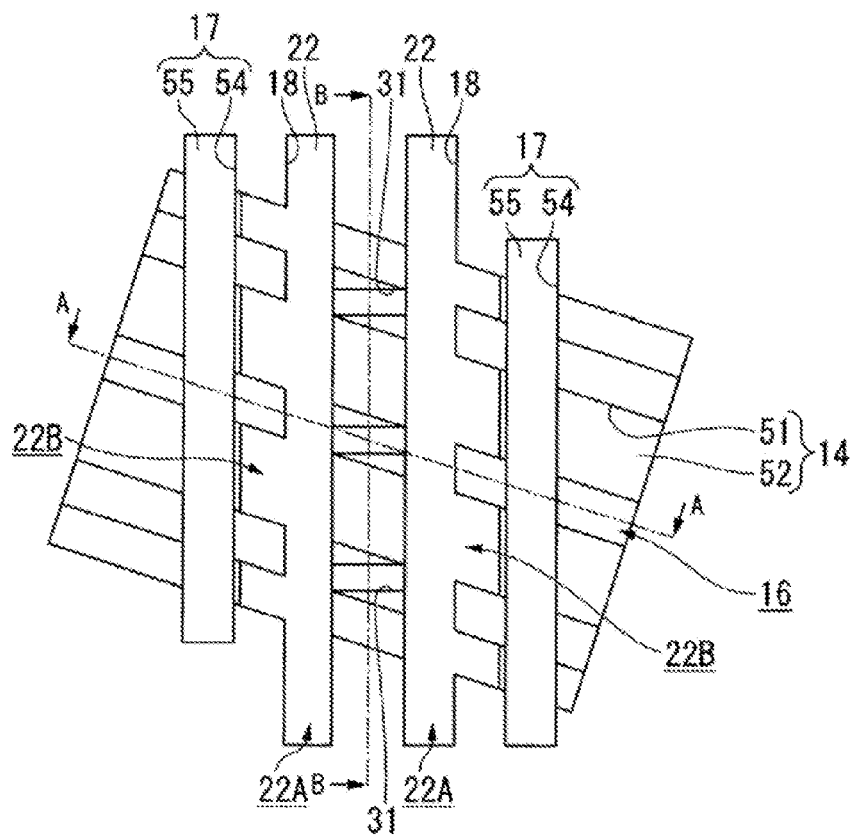
FIG. 16A is a plane view of a region where a memory cell array is formed, showing a production process (Part 14) of a memory cell array that the semiconductor device described in FIG. 1 has.
Figure 16B:
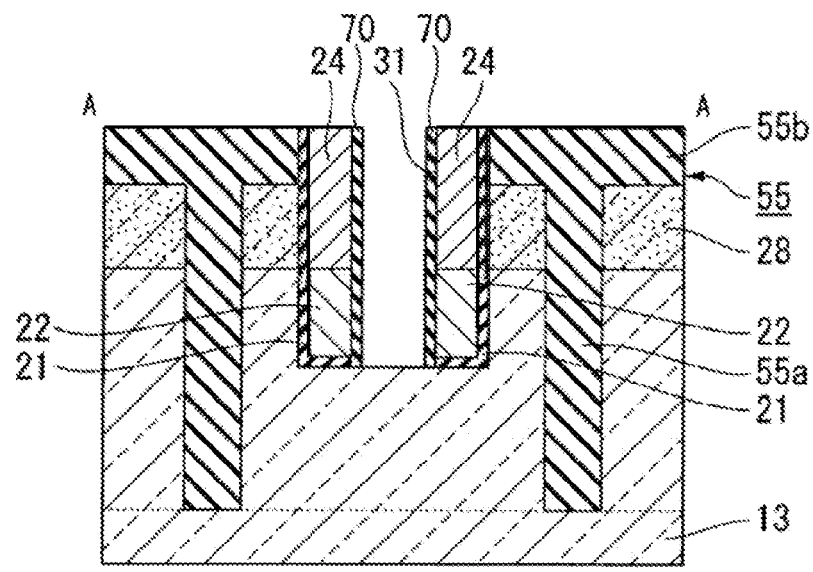
FIG. 16B is a cross-sectional view of a semiconductor device taken along line A-A of FIG. 16A.
Figure 16C:
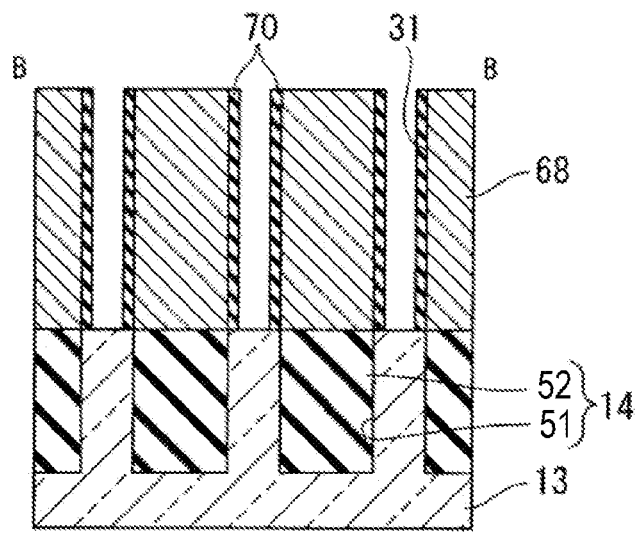
FIG. 16C is a cross-sectional view of a semiconductor device taken along line B-B of FIG. 16A.

Then, as shown in FIGS. 16A to 16C, the CVD method is used to form an insulation film 70, which is for example made from a silicon nitride film, in such away that the insulation film 70 covers an inner face of a bit line contact hole 31, and upper surfaces of an embedded insulation film 24 and a second element isolation insulation film 55. Then, dry etching is used to perform etching-back of an entire surface of the insulation film 70. As a result, portions of the insulation film 70 that are positioned on the upper surfaces of the embedded insulation film 24 and second element isolation insulation film 55 and a bottom face of the bit line contact hole 31 are removed; only on a portion that goes along a side face of the bit line contact hole 31, the insulation film 70 remains. The insulation film 70 is designed to insulate a bit line contact plug 33, which is later formed, and each gate electrode 22.

Figure 17A:
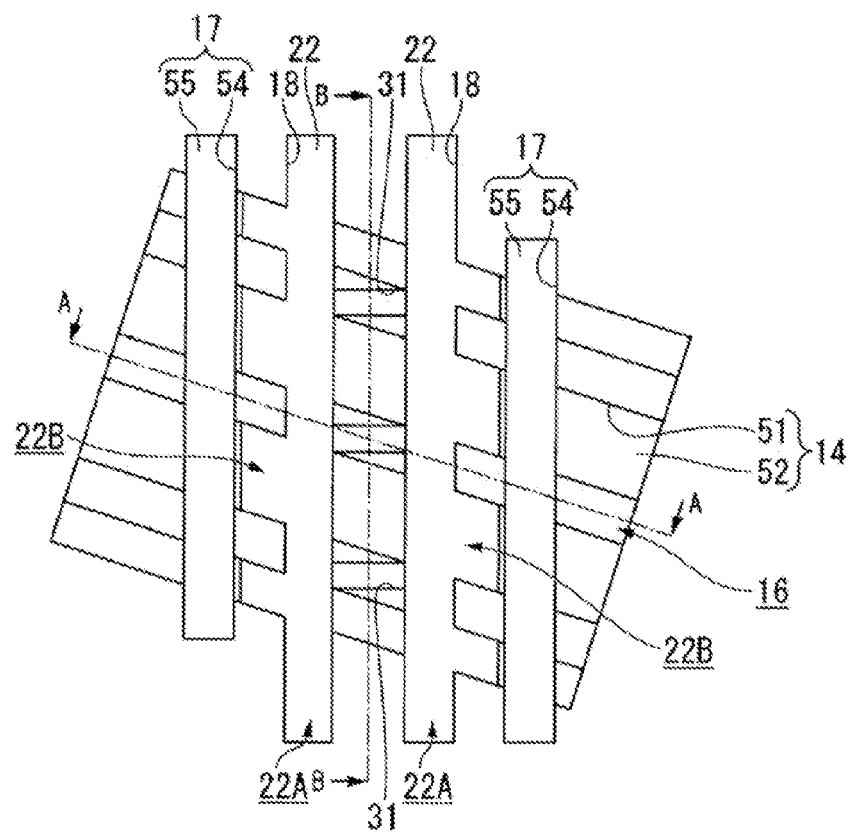
FIG. 17A is a plane view of a region where a memory cell array is formed, showing a production process (Part 15) of a memory cell array that the semiconductor device described in FIG. 1 has.
Figure 17B:
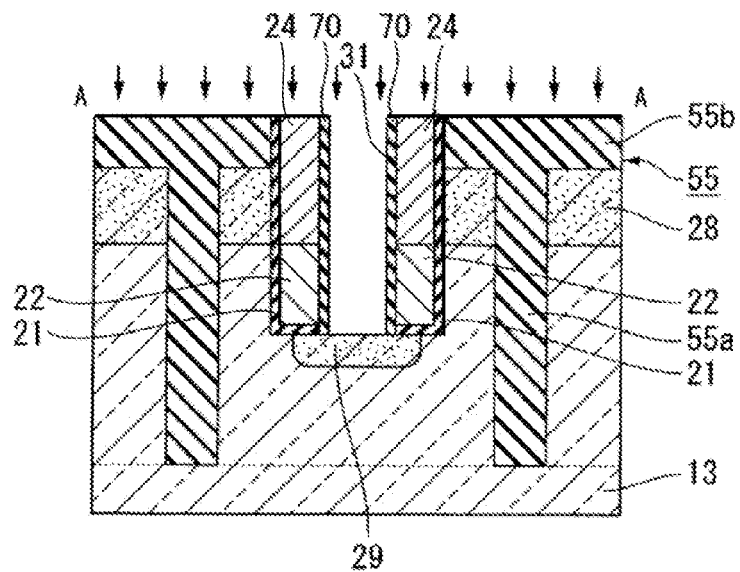
FIG. 17B is a cross-sectional view of a semiconductor device taken along line A-A of FIG. 17A.
Figure 17C:
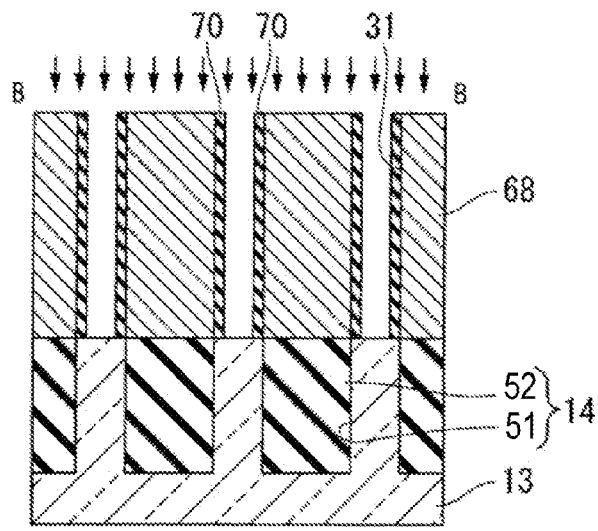
FIG. 17C is a cross-sectional view of a semiconductor device taken along line B-B of FIG. 17A.

Then, as shown in FIGS. 17A to 17C, a portion of the semiconductor substrate 13 that is exposed from a bottom surface of a bit line contact hole 31 is ion-implanted with phosphorus (P), which is a n-type impurity (or an impurity of a different conductivity type from a p-type silicon substrate that is used for the semiconductor substrate 13) with an energy of 100 KeV and a dose of $1 \times 10^{14}$ atoms/$cm^2$. As a result, in a portion of the semiconductor substrate 13 between two gate-electrode trenches 18, a second impurity diffusion region 29 is formed.

Figure 18A:
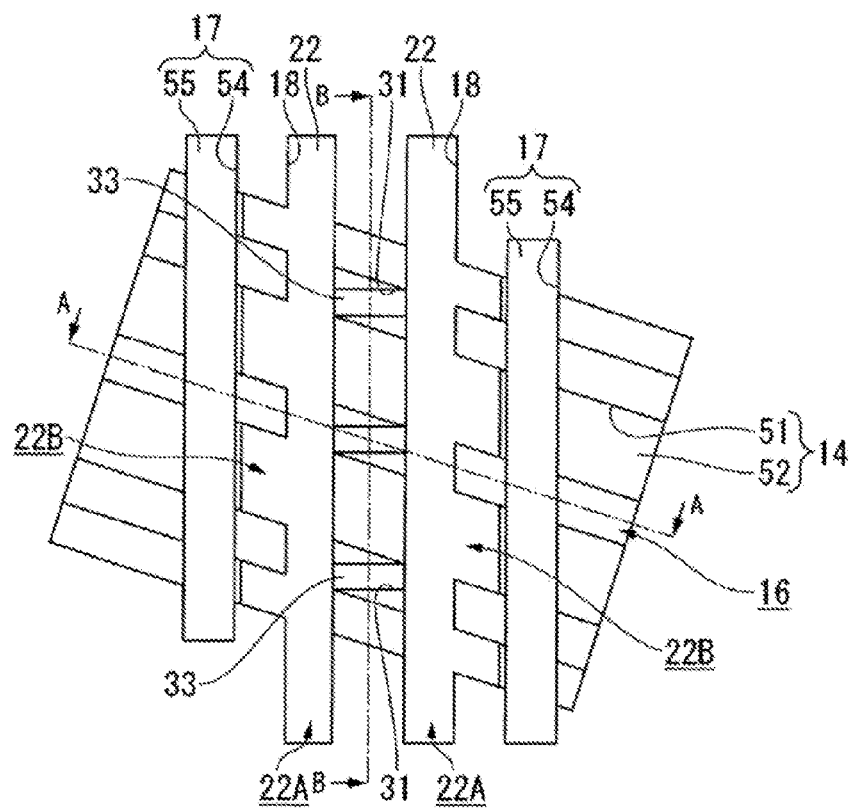
FIG. 18A is a plane view of a region where a memory cell array is formed, showing a production process (Part 16) of a memory cell array that the semiconductor device described in FIG. 1 has.
Figure 18B:
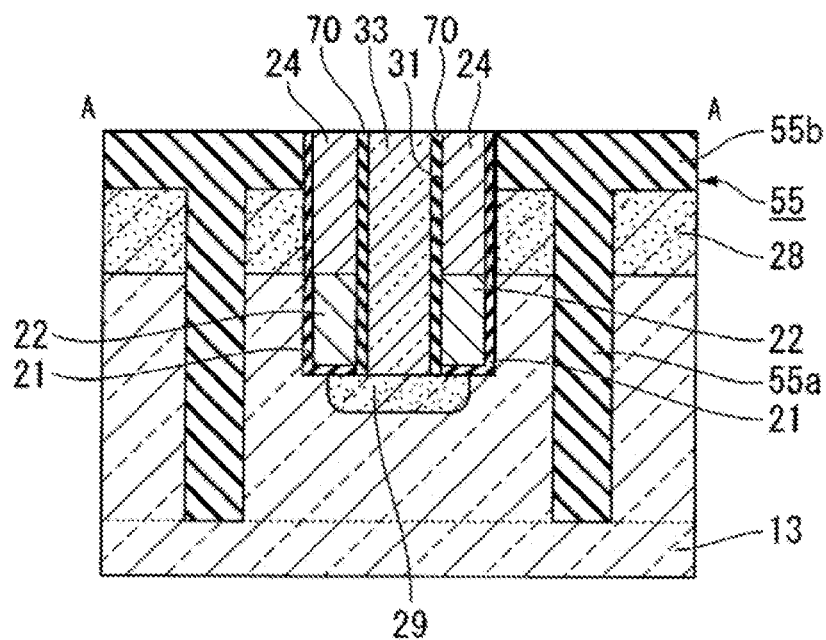
FIG. 18B is a cross-sectional view of a semiconductor device taken along line A-A of FIG. 18A.
Figure 18C:
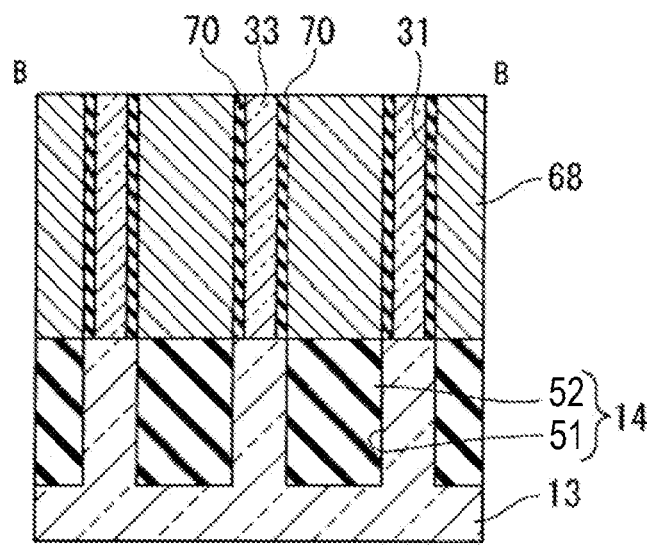
FIG. 18C is a cross-sectional view of a semiconductor device taken along line B-B of FIG. 18A.

Then, as shown in FIGS. 18A to 18C, a bit line contact plug 33 is so formed as to be embedded in a bit line contact hole 31. More specifically, the CVD method is used to form a polysilicon film on the upper surfaces of the embedded insulation film 24 and second element isolation insulation film 55 in such a way that the polysilicon film is embedded in the bit line contact hole 31. Impurities are added to the polysilicon film to make the polysilicon film conductive. After that, CMP is used for polishing, and the polysilicon film is therefore removed from the upper surfaces of the embedded insulation film 24 and second element isolation insulation film 55. As a result, the polysilicon film remains only in the bit line contact hole 31. In this manner, the bit line contact plug 33 is formed.

Figure 19:
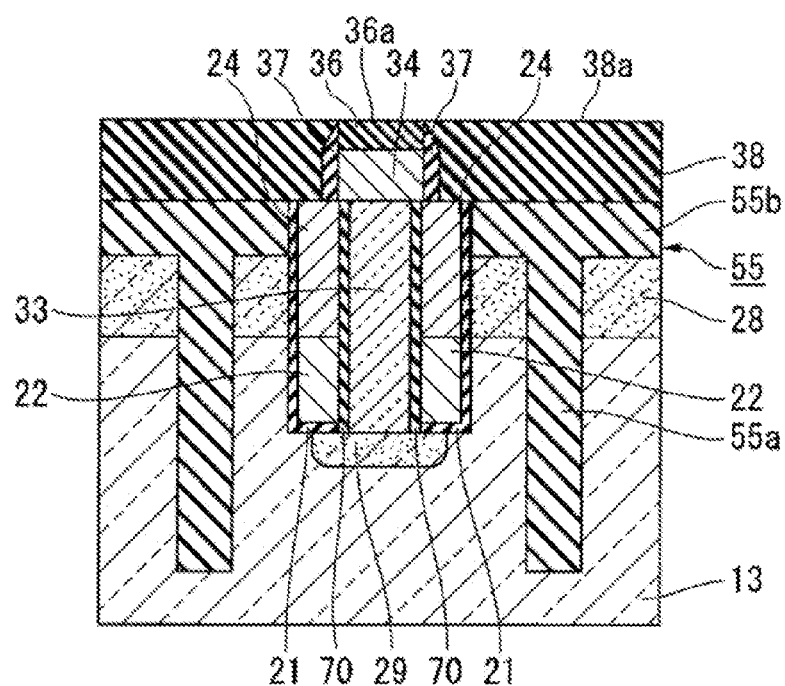
FIG. 19 is a diagram showing a cross section of a semiconductor device corresponding to FIG. 2, showing a production process (Part 17) of a memory cell array that the semiconductor device described in FIG. 1 has.

Then, as shown in FIG. 19, a titanium nitride film (not shown) and a tungsten film (not shown), which are constituent materials of a bit line 34, are sequentially formed. Furthermore, on an upper surface of the formed tungsten film, a silicon nitride film (SiN film), which is a constituent material of a cap insulation film 36, is formed. After that, photolithography is used to form a photoresist (not shown) on the silicon nitride film (SiN film) in such a way that a formation region of a bit line 34 is covered with the photoresist.

Then, by using the photoresist as a mask, anisotropic etching (or more specifically, dry etching) is carried out to perform patterning of the silicon nitride film (SiN film), the tungsten film, and the titanium nitride film. As a result, a cap insulation film 36 and a bit line 34 are formed at once: the cap insulation film 36 is made from a silicon nitride film (SiN film), and the bit line 34 is disposed on the bit line contact plug 33 and is made from a titanium nitride film and a tungsten film.

Then, a silicon nitride film (SiN film) and a silicon dioxide film ($SiO_2$ film), which are not shown in the diagrams, are sequentially formed so as to cover side faces of the bit line 34 and the cap insulation film 36. After that, etching-back of entire surfaces of the silicon dioxide film ($SiO_2$ film) and silicon nitride film (SiN film) is carried out, thereby forming sidewall films 37 that cover side faces of the cap insulation film 36 and side faces of the bit line 34.

In that manner, the sidewall films 37 are a stacked film made up of a silicon nitride film (SiN film) and a silicon dioxide film ($SiO_2$ film). Therefore, when a coating-type insulation film (or more specifically, a silicon dioxide film ($SiO_2$ film)) is formed by the SOG method as the interlayer insulation film 38, an improvement can be made in the wettability of the silicon dioxide film (coating-type insulation film). As a result, it is possible to keep voids from being generated into the silicon dioxide film (coating-type insulation film).

Then, an interlayer insulation film 38 is formed on upper surfaces of the embedded insulation films 24 and upper surfaces of the second element isolation insulation films 55 in such a way as to cover the sidewall films 37, and have an upper surface 38a that is flush with the upper surface 36a of the cap insulation film 36. As a result, the upper surface 36a of the cap insulation film 36 is exposed from the interlayer insulation film 38.

More specifically, on the upper surfaces of the embedded insulation films 24 and the upper surfaces of the second element isolation insulation films 55, an insulation film (silicon dioxide film ($SiO_2$ film)) is applied by the SOG method in such a way as to cover the sidewall films 37. Then, thermal treatment is carried out to turn the silicon dioxide film (coating-type insulation film) into a dense film. When the silicon dioxide film (coating-type insulation film) is formed by the above SOG method, a coating solution containing polysilazane is preferably used. The thermal treatment may be carried out in a water vapor atmosphere.

Then, the CMP method is used to polish the thermally-treated silicon dioxide film (coating-type insulation film) until the upper surface 36a of the cap insulation film 36 is exposed. As a result, the interlayer insulation film 38 whose upper surface 38a is flush with the upper surface 36a of the cap insulation film 36 is formed. Incidentally, although not shown in FIG. 19, after polishing of the above silicon dioxide film (coating-type insulation film), a silicon dioxide film ($SiO_2$ film) may be formed by the CVD method in such a way as to cover the upper surface 36a of the cap insulation film 36 and the upper surface 38a of the interlayer insulation film 38.

Figure 20:
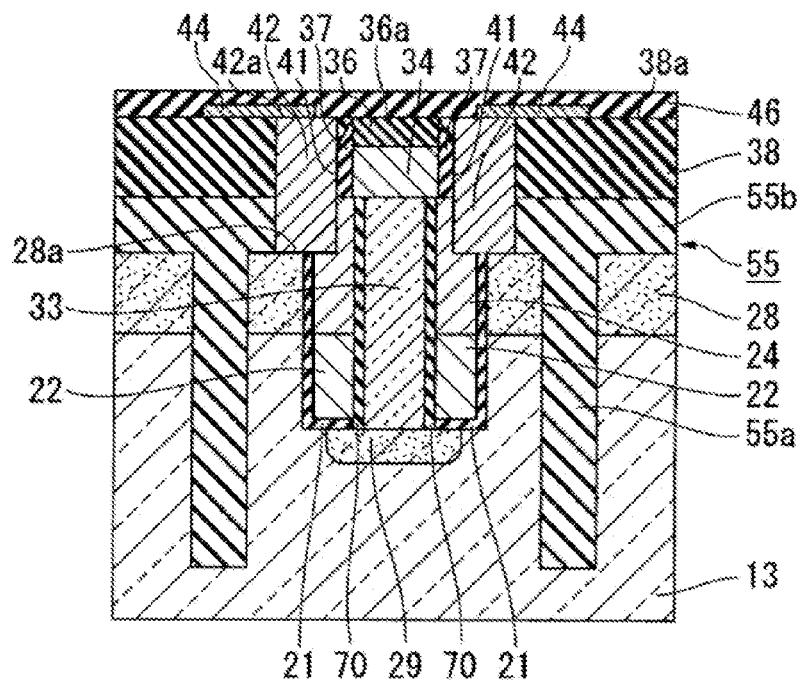
FIG. 20 is a diagram showing a cross section of a semiconductor device corresponding to FIG. 2, showing a production process (Part 18) of a memory cell array that the semiconductor device described in FIG. 1 has.

Then, as shown in FIG. 20, the SAC (Self-Aligned Contact) method is used to carry out anisotropic etching (or more specifically, dry etching) of some portions of the interlayer insulating film 38, embedded insulation films 24, and second element isolation insulation films 55. As a result, a capacitance contact hole 41 is so formed as to expose a part of an upper surface 28a of a first impurity diffusion region 28. At this time, the dry-etching process is carried out by dividing into the following two steps: a step of selectively etching a silicon dioxide film ($SiO_2$ film), and a step of selectively etching a silicon nitride film (SiN film).

Then, in the capacitance contact hole 41, a capacitance contact plug 42 is formed: an upper surface 42a thereof is flush with the upper surface 38a of the interlayer insulation film 38; and a lower end thereof is in contact with the upper surface 28a of the first impurity diffusion region 28. More specifically, the CVD method is used to sequentially stack a titanium nitride film (not shown) and a tungsten film (not shown) in such a way that the titanium nitride film and the tungsten film are embedded in the capacitance contact hole 41. Then, the CMP method is used for polishing, thereby removing an unnecessary titanium nitride film and tungsten film formed on the upper surface 38a of the interlayer insulation film 38. As a result, in the capacitance contact hole 41, the capacitance contact plug 42, which is made from the titanium nitride film and the tungsten film, is formed.

Then, on the upper surface 38a of the interlayer insulation film 38, a capacitance contact pad 44 is so formed as to be in contact with a part of an upper surface 42a of a capacitance contact plug 42. More specifically, a metal film (not shown), which is a base material for the capacitance contact pad 44, is so formed as to cover an upper surface 36a of a cap insulation film 36, an upper surface 42a of a capacitance contact plug 42, and an upper surface 38a of an interlayer insulation film 38.

Then, photolithography is used to form a photoresist (not shown) that covers an area of an upper surface of the metal film that corresponds to a formation region of a capacitance contact pad 44. By using the photoresist as a mask, dry etching is performed to remove portions of the metal film that are not covered with the photoresist. As a result, a capacitance contact pad 44, which is made from the metal film, is formed. After the capacitance contact pads 44 are formed, the photoresist is removed. Then, on an upper surface 36a of a cap insulation film 36, an upper surface 42a of a capacitance contact plug 42, and an upper surface 38a of an interlayer insulation film 38, a silicon nitride film 46 is so formed as to cover the capacitance contact pad 44.

Then, on the silicon nitride film 46, a thick silicon dioxide film ($SiO_2$ film), which is not shown in the diagram, is formed. For example, it is preferred that the thickness of the silicon dioxide film ($SiO_2$ film) be 1,500 nm. Then, photolithography is used to form a patterned photoresist (not shown) on the silicon dioxide film ($SiO_2$ film). By using the photoresist as a mask, dry etching is used to perform etching of the silicon dioxide film (not shown) and silicon nitride film 46 that are formed on the capacitance contact pads 44. As a result, cylinder holes (not shown) are so formed as to expose the capacitance contact pads 44. After that, the photoresist (not shown) is removed.

Figure 21:
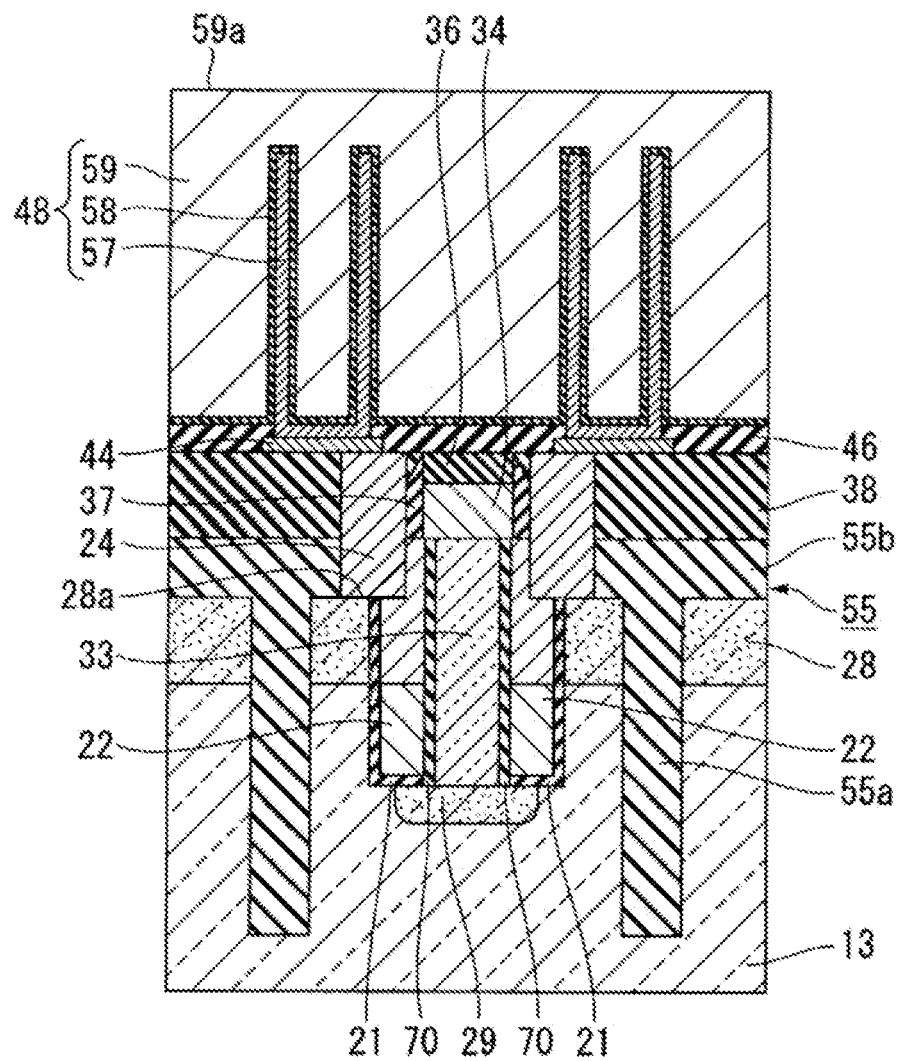
FIG. 21 is a diagram showing a cross section of a semiconductor device corresponding to FIG. 2, showing a production process (Part 19) of a memory cell array that the semiconductor device described in FIG. 1 has.

Then, on inner surfaces of the cylinder holes (not shown), and on upper surfaces of the capacitance contact pads 44, a conductive film (e.g. titanium nitride film) is formed. As a result, as shown in FIG. 21, a cylindrical lower electrode 57 is formed: the cylindrical lower electrode 57 is made from the conductive film, and an upper portion thereof is opened. Then, wet etching is carried out to remove the silicon dioxide film (not shown), thereby exposing an upper surface of the silicon nitride film 46. Then, a capacitance insulation film 58 is so formed as to cover the upper surface of the silicon nitride film 46 and the lower electrode 57.

Then, an upper electrode 59 is so formed as to cover a surface of the capacitance insulation film 58. At this time, the upper electrode 59 is formed in such a way that an upper surface 59a of the upper electrode 59 is positioned above the capacitance insulation film 58. In this manner, on each capacitance contact pad 44, a capacitor 48, which includes a lower electrode 57, a capacitance insulation film 58, and an upper electrode 59, is formed. In that manner, the semiconductor device 10 of the present embodiment is produced. In reality, on the upper surface 59a of the upper electrode 59, an interlayer insulation film, via, wire, and the like, which are not shown in the diagram, are also formed.

According to the method of producing the semiconductor device 10 of the present embodiment, the constituent material of a first element isolation insulation film 52 is different from the constituent material of a second element isolation insulation film 55. After a gate-electrode trench 65 is formed, wet etching is carried out with the use of an etching solution that can selectively etch a first element isolation insulation film 52. Therefore, a portion corresponding to a second trench portion 65B of a gate-electrode trench 65 can be precisely processed into a desired shape and size. As a result, it is possible to easily produce the semiconductor device 10 having the first transistor 19-1 and second transistor 19-2 with a high on-state current that are excellent in performance.

Moreover, according to the method of producing the semiconductor device 10 of the present embodiment, a gate electrode 22 is so formed as to include a first electrode portion 22A, which is embedded in a first trench portion 18A of a gate-electrode trench 18 through a gate insulation film 21, and a second electrode portion 22B, which is embedded in a second trench portion 18B through a gate insulation film 21. Furthermore, an embedded insulation film 24 is formed in a gate-electrode trench 18 so as to cover an upper face of the gate electrode 22. Therefore, the gate electrode 22 does not protrude above the surface of the semiconductor substrate 13.

Accordingly, for example, when a DRAM is formed as the semiconductor device 10, it becomes easier to form bit lines 34 and capacitors 48 in subsequent processes. Thus, the semiconductor device 10 can be easily produced.

Incidentally, the scope of the present invention is not limited to the embodiment described above, and various modifications may be made without departing from the spirit of the invention. For example, the types, sizes, film thickness, production conditions, and any other factors of films that constitute each component of the semiconductor device illustrated in the above embodiment can be changed when necessary.

In addition, while not specifically claimed in the claim section, the applicant reserves the right to include in the claim section of the application at any appropriate time the following methods:

C1. A method of manufacturing a semiconductor device, the method comprising:
forming a first impurity diffusion region in a surface of a semiconductor substrate;
forming a gate-electrode trench in the semiconductor substrate in which the first impurity diffusion region is formed, the gate-electrode trench including a first trench portion, which extends in a first direction, second trench portions, which diverge from the first trench portion and extend in a second direction that crosses the first direction, a first and a second side face, which face each other, and a bottom face;
forming a gate insulation film at least along the first side face, second side face, and bottom face of the gate-electrode trench;
forming a gate electrode that includes a first electrode portion, which is embedded in the first trench portion through the gate insulation film, and second electrode portions, which are embedded in the second trench portions through the gate insulation film;
forming an embedded insulation film that is embedded in the gate-electrode trench so as to cover an upper surface of the gate electrode; and
forming a second impurity diffusion region in a region of the semiconductor substrate that is in contact with at least a part of the gate insulation film provided along the bottom face,
the first impurity diffusion region being sandwiched between the first electrode portion and the two second electrode portions when seen from a normal direction of the semiconductor substrate.

C2. The method of manufacturing the semiconductor device as claimed in claim C1, further comprising:
forming, on the semiconductor substrate, a first element isolation trench extending in the second direction;
embedding a first element isolation insulation film in the first element isolation trench to form a first element isolation region that partitions an active region containing a plurality of element formation regions;
forming, on the semiconductor substrate, a second element isolation trench extending in the first direction; and
embedding a second element isolation insulation film in the second element isolation trench to form a second element isolation region that partitions the active region into a plurality of the element formation regions.

C3. The method of manufacturing the semiconductor device as claimed in claim C2, wherein:
a material of the first element isolation insulation film is different from a material of the second element isolation insulation film; and
when the gate-electrode trench is formed, wet etching is carried out with the use of an etching solution that can selectively etch the first element isolation insulation film out of the first and second element isolation insulation films exposed from an inner face of the gate-electrode trench, and the first element isolation insulation film exposed from the inner face of the gate-electrode trench is therefore selectively removed to form the second trench portion.

C4. The method of manufacturing the semiconductor device as claimed in claim C1, further comprising
forming a bit line contact plug that is in contact with the second impurity diffusion region, wherein:
the second impurity diffusion region is formed as the semiconductor substrate is ion-implanted through the bottom face after the gate-electrode trench is formed; and
the bit line contact plug is formed by embedding a conductor in at least an inner portion of the gate-electrode trench other than the gate electrode.

C5. The method of manufacturing the semiconductor device as claimed in claim C4, further comprising
forming a bit line that is electrically connected to the bit line contact plug and extends in a direction that crosses the gate electrode.

C6. The method of manufacturing the semiconductor device as claimed in claim C1, further comprising:
forming an interlayer insulation film above the semiconductor substrate;
embedding, in the embedded insulation film and the interlayer insulation film, a capacitance contact plug that is in contact with the first impurity diffusion region;
forming, on the interlayer insulation film, a capacitance contact pad that is in contact with the capacitance contact plug; and
forming a capacitor on the capacitance contact pad.

What is claimed is:

1. A semiconductor device comprising:
a semiconductor substrate having a gate trench that includes a first side surface, a second side surface facing to the first side surface and a bottom surface;
a gate insulation film covering the first side surface, the second side surface and the bottom surface of the gate trench;
a gate electrode embedded in a lower portion of the gate trench with an intervention of the gate insulation film;
an embedded insulation film embedded in an upper portion of the gate trench so as to cover an upper surface of the gate electrode,
an element isolation region;
the semiconductor substrate including a first impurity diffusion region facing the embedded insulation film in lateral direction and a second impurity diffusion region that is in contact with at least a part of the gate insulation film provided on the bottom surface of the gate trench,
the gate trench including a first trench portion extending in a first direction and second and third trench portions branching from the first trench portion and extending in a second direction that crosses the first direction,
the gate electrode including first, second and third electrode portions embedded in the first, second and third trench portions of the gate trench, respectively, and
the first impurity diffusion region being surrounded by the second and third electrode portions; and
an active region extending substantially in the second direction, wherein
the second and third trench portions do not at least partially overlap with the active region in plan view,
at least one portion of the active region includes a first side, a second side facing the first side in the first direction, a third side, and a fourth side facing the third side in the second direction, and the element isolation region is formed on one side of the first, second, third and fourth sides and the gate trench is formed on other three sides of the first, second, third and fourth sides.

2. The semiconductor device as claimed in claim 1, further comprising a bit line that crosses the first electrode portion, the bit line being electrically connected to the second impurity diffusion region.

3. The semiconductor device as claimed in claim 2, further comprising a bit line contact plug that electrically connects the second impurity diffusion region to the bit line.

4. The semiconductor device as claimed in claim 1, further comprising:
- an interlayer insulation film that covers the semiconductor substrate;
- a capacitance contact plug that is embedded in the interlayer insulation film, the capacitance contact plug having top and bottom end, the bottom end of the capacitance contact plug being in contact with the embedded insulation film and the first impurity diffusion region;
- a capacitance contact pad that is provided on the interlayer insulation film, the capacitance contact pad being in contact with the top end of the capacitance contact plug; and
- a capacitor that is provided on the capacitance contact pad.

5. The semiconductor device as claimed in claim 1, further comprising
- a semiconductor pillar including the first impurity diffusion region and a part of the semiconductor substrate that is a p-type semiconductor and connected to the bottom surface of the first impurity diffusion region.

6. The semiconductor device as claimed in claim 5, further comprising
- a vertical transistor, wherein
- a channel region of the vertical transistor is formed in the part of the semiconductor substrate.

7. The semiconductor device as claimed in claim 6, further comprising:
- a first element isolation region that extends in the second direction; and
- a second element isolation region that extends in the first direction, wherein
- the semiconductor substrate further having a second isolation trench extending in the second direction,
- the second element isolation region includes a second isolation insulation film that is embedded in the second isolation trench, and
- the channel region is surrounded by a side surface of the second isolation trench, a side surface of the first trench portion, a side surface of the second trench portion, and a side surface of the third trench portion, the side surface of the second isolation trench and the side surface of the first trench portion face each other in the second direction, the side surface of the second trench portion and the side surface of the third trench portion face each other in the first direction.

8. The semiconductor device as claimed in claim 6, wherein
- the gate insulation film is arranged between the channel region and each of the side surfaces of the first to third trench portions.

9. The semiconductor device as claimed in claim 1, wherein
- the gate electrode includes:
- a first gate electrode arranged on a side surface of the first trench portion so as to cover the gate insulation film; and
- a second gate electrode arranged on side surfaces of the second and third trench portions so as to cover the gate insulation film.

10. The semiconductor device as claimed in claim 1, wherein the first impurity diffusion region is surrounded by the second and third electrode portions in a configuration in which there is one second electrode portion and two third electrode portions in parallel, where the second and third electrode portions cross to surround the first impurity region.

11. The semiconductor device as claimed in claim 1, wherein a length of the third trench portion is equal to a word line half pitch.

12. The semiconductor device as claimed in claim 1, wherein a length of the second trench portion is equal to a word line half pitch.

13. The semiconductor device as claimed in claim 1, wherein the element isolation region comprises:
- a first element isolation region that extends in the second direction; and
- a second element isolation region that extends in the first direction.

14. The semiconductor device as claimed in claim 1, wherein the gate trench is formed on the first side, the second side, and the third side, and the element isolation region is formed on the fourth side.

15. The semiconductor device as claimed in claim 13, wherein the semiconductor substrate further has a first isolation trench extending in the first direction, and the first element isolation region includes a first isolation insulation film that is embedded in the first isolation trench.

16. The semiconductor device as claimed in claim 13, wherein the semiconductor substrate further has a second isolation trench extending in the second direction, and the second element isolation region includes a second isolation insulation film that is embedded in the second isolation trench.

17. The semiconductor device as claimed in claim 15, wherein the gate electrode trench has a depth shallower than that of the first element isolation trench.

18. The semiconductor device as claimed in claim 16, wherein the gate electrode trench has a depth shallower than that of the second element isolation trench.

* * * * *